(12) United States Patent
Kretz

(10) Patent No.: US 9,104,366 B2
(45) Date of Patent: Aug. 11, 2015

(54) SEPARATION OF SCREEN USAGE FOR COMPLEX LANGUAGE INPUT

(71) Applicant: Andreas Kretz, Burlington (CA)

(72) Inventor: Andreas Kretz, Burlington (CA)

(73) Assignee: Z124, George Town (KY)

( * ) Notice: Subject to any disclaimer, the term of this patent is extended or adjusted under 35 U.S.C. 154(b) by 203 days.

(21) Appl. No.: 13/628,157

(22) Filed: Sep. 27, 2012

(65) Prior Publication Data

US 2013/0076677 A1    Mar. 28, 2013

Related U.S. Application Data

(60) Provisional application No. 61/539,884, filed on Sep. 27, 2011.

(51) Int. Cl.
*G06F 3/14* (2006.01)
*G09G 5/34* (2006.01)
(Continued)

(52) U.S. Cl.
CPC ........ *G06F 3/1423* (2013.01); *B29D 11/00673* (2013.01); *E05D 3/12* (2013.01); *G02B 6/0001* (2013.01); *G06F 1/1601* (2013.01); *G06F 1/1616* (2013.01); *G06F 1/1637* (2013.01); *G06F 1/1641* (2013.01); *G06F 1/1692* (2013.01); *G06F 3/00* (2013.01); *G06F 3/01* (2013.01); *G06F 3/041* (2013.01); *G06F 3/048* (2013.01); *G06F 3/0412* (2013.01); *G06F 3/0481* (2013.01); *G06F 3/0483* (2013.01); *G06F 3/04883* (2013.01); *G06F 3/04897* (2013.01); *G06F 9/44* (2013.01); *G06F 9/4443* (2013.01); *G09G 1/00* (2013.01); *G09G 5/00* (2013.01); *G09G 5/14* (2013.01); *G09G 5/34* (2013.01); *H04M 1/0266* (2013.01); *H04N 5/44591* (2013.01); *H04W 72/06* (2013.01); *H04W 88/06* (2013.01); *H05K 5/0017* (2013.01); *H05K 5/0226* (2013.01); *H05K 5/04* (2013.01); *H05K 7/02* (2013.01); *H05K 7/1452* (2013.01); *H05K 13/00* (2013.01); *H05K 13/046* (2013.01);
(Continued)

(58) Field of Classification Search
CPC ..... G06T 11/00; G06F 3/041; G06F 3/04883; G09G 5/00
See application file for complete search history.

(56) References Cited

U.S. PATENT DOCUMENTS 5,396,630 A    3/1995   Banda et al.
5,673,403 A    9/1997   Brown et al.
(Continued)

FOREIGN PATENT DOCUMENTS

JP    7-219903    8/1995
JP    08-115144   5/1996
(Continued)

OTHER PUBLICATIONS

U.S. Appl. No. 14/068,662, filed Oct. 31, 2013, Benedek.
(Continued)

*Primary Examiner* — Michael Faragalla
(74) *Attorney, Agent, or Firm* — Sheridan Ross P.C.

(57) ABSTRACT

Methods and devices including providing a device having at least a primary screen and a secondary screen; receiving a first input, where the first input includes a language input on the primary screen; processing the first input to estimate a character based on the first input; displaying the estimated character(s); and displaying a selection, where the selection includes a chosen character selected from the estimated character(s).

20 Claims, 27 Drawing Sheets

(51) Int. Cl.

| | | |
|---|---|---|
| H04M 1/02 | (2006.01) | |
| G06F 1/16 | (2006.01) | |
| G09G 5/00 | (2006.01) | |
| G06F 3/041 | (2006.01) | |
| G09G 1/00 | (2006.01) | |
| H05K 5/02 | (2006.01) | |
| H05K 5/00 | (2006.01) | |
| H05K 13/00 | (2006.01) | |
| H04N 5/445 | (2011.01) | |
| H05K 7/02 | (2006.01) | |
| E05D 3/12 | (2006.01) | |
| H05K 13/04 | (2006.01) | |
| H05K 5/04 | (2006.01) | |
| H05K 7/14 | (2006.01) | |
| B29D 11/00 | (2006.01) | |
| F21V 8/00 | (2006.01) | |
| G06F 3/01 | (2006.01) | |
| G06F 3/048 | (2013.01) | |
| G06F 3/0489 | (2013.01) | |
| G06F 3/00 | (2006.01) | |
| G06F 9/44 | (2006.01) | |
| G06F 3/0481 | (2013.01) | |
| G06F 3/0483 | (2013.01) | |
| G06F 3/0488 | (2013.01) | |
| G09G 5/14 | (2006.01) | |
| H04W 72/06 | (2009.01) | |
| H04W 88/06 | (2009.01) | |
| H04W 48/18 | (2009.01) | |

(52) U.S. Cl.
CPC ............ *G06F 3/1438* (2013.01); *G06F 3/1446* (2013.01); *H04W 48/18* (2013.01); *Y10T 16/547* (2015.01); *Y10T 29/4984* (2015.01); *Y10T 29/49826* (2015.01)

(56) References Cited

U.S. PATENT DOCUMENTS

| | | | |
|---|---|---|---|
| 5,764,984 | A | 6/1998 | Loucks |
| 5,874,928 | A | 2/1999 | Kou |
| 6,108,715 | A | 8/2000 | Leach et al. |
| 6,157,959 | A | 12/2000 | Bonham et al. |
| 6,178,503 | B1 | 1/2001 | Madden et al. |
| 6,182,158 | B1 | 1/2001 | Kougiouris et al. |
| 6,260,075 | B1 | 7/2001 | Cabrero et al. |
| 6,477,585 | B1 | 11/2002 | Cohen et al. |
| 6,486,890 | B1 | 11/2002 | Harada et al. |
| 6,507,336 | B1 | 1/2003 | Lunsford |
| 6,573,913 | B1 | 6/2003 | Butler et al. |
| 6,694,368 | B1 | 2/2004 | An et al. |
| 6,826,703 | B2 | 11/2004 | Kawano et al. |
| 6,917,963 | B1 | 7/2005 | Hipp et al. |
| 6,927,908 | B2 | 8/2005 | Stark |
| 6,961,941 | B1 | 11/2005 | Nelson et al. |
| 6,970,173 | B2 | 11/2005 | Ciolac |
| 7,007,240 | B1 | 2/2006 | Anderson et al. |
| 7,069,519 | B1 | 6/2006 | Okude et al. |
| 7,127,723 | B2 | 10/2006 | Endo et al. |
| 7,176,943 | B2 | 2/2007 | Meyers et al. |
| 7,284,203 | B1 | 10/2007 | Meeks et al. |
| 7,424,601 | B2 | 9/2008 | Xu |
| 7,453,465 | B2 | 11/2008 | Schmieder et al. |
| 7,478,341 | B2 | 1/2009 | Dove |
| 7,489,503 | B2 | 2/2009 | Maatta |
| 7,565,535 | B2 | 7/2009 | Roberts et al. |
| 7,681,134 | B1 | 3/2010 | Grechishkin et al. |
| 7,705,799 | B2 | 4/2010 | Niwa |
| 7,880,728 | B2 | 2/2011 | de los Reyes et al. |
| 7,949,633 | B1 | 5/2011 | Shaver et al. |
| 7,950,008 | B2 | 5/2011 | Bhide et al. |
| 7,960,945 | B1 | 6/2011 | Onorato et al. |
| 8,194,001 | B2 | 6/2012 | Miller et al. |
| 8,397,245 | B2 | 3/2013 | Filali-Adib et al. |
| 8,704,777 | B2 | 4/2014 | Small et al. |
| 2002/0010844 | A1 | 1/2002 | Noel et al. |
| 2002/0015881 | A1 | 2/2002 | Nakamura et al. |
| 2002/0130888 | A1 | 9/2002 | Perry et al. |
| 2002/0157001 | A1 | 10/2002 | Huang et al. |
| 2002/0158811 | A1 | 10/2002 | Davis |
| 2003/0001848 | A1 | 1/2003 | Doyle et al. |
| 2003/0017417 | A1 | 1/2003 | Goodin et al. |
| 2003/0020954 | A1 | 1/2003 | Udom et al. |
| 2003/0079010 | A1 | 4/2003 | Osborn |
| 2003/0079205 | A1 | 4/2003 | Miyao et al. |
| 2003/0115443 | A1 | 6/2003 | Cepulis et al. |
| 2003/0131143 | A1 | 7/2003 | Myers |
| 2003/0174172 | A1 | 9/2003 | Conrad et al. |
| 2003/0177285 | A1 | 9/2003 | Hunt et al. |
| 2003/0179541 | A1 | 9/2003 | Sullivan |
| 2003/0226116 | A1 | 12/2003 | Kuwata et al. |
| 2004/0137855 | A1 | 7/2004 | Wiley et al. |
| 2004/0141085 | A1 | 7/2004 | Nickel et al. |
| 2004/0226023 | A1 | 11/2004 | Tucker |
| 2005/0034017 | A1 | 2/2005 | Airaud et al. |
| 2005/0083642 | A1 | 4/2005 | Senpuku et al. |
| 2005/0193267 | A1 | 9/2005 | Liu et al. |
| 2005/0216594 | A1 | 9/2005 | O'Brien et al. |
| 2005/0237587 | A1 | 10/2005 | Nakamura |
| 2005/0246505 | A1 | 11/2005 | McKenney et al. |
| 2005/0248501 | A1 | 11/2005 | Kim |
| 2006/0005187 | A1 | 1/2006 | Neil |
| 2006/0031572 | A1 | 2/2006 | Feuerstein et al. |
| 2006/0107020 | A1 | 5/2006 | Stillwell, Jr. et al. |
| 2006/0136828 | A1 | 6/2006 | Asano |
| 2006/0139862 | A1 | 6/2006 | Wang et al. |
| 2006/0183505 | A1 | 8/2006 | Willrich |
| 2006/0187142 | A1 | 8/2006 | Lesniak |
| 2006/0227806 | A1 | 10/2006 | Tseng |
| 2006/0248404 | A1 | 11/2006 | Lindsay et al. |
| 2007/0005661 | A1 | 1/2007 | Yang |
| 2007/0014295 | A1 | 1/2007 | Fernandes et al. |
| 2007/0022155 | A1 | 1/2007 | Owens et al. |
| 2007/0033260 | A1 | 2/2007 | Grouzdev et al. |
| 2007/0050751 | A1 | 3/2007 | Husmann et al. |
| 2007/0067769 | A1 | 3/2007 | Geisinger |
| 2007/0085759 | A1* | 4/2007 | Lee et al. ................ 345/1.1 |
| 2007/0111750 | A1 | 5/2007 | Stohr et al. |
| 2007/0136356 | A1 | 6/2007 | Smith et al. |
| 2007/0156729 | A1 | 7/2007 | Shaylor |
| 2007/0164923 | A1 | 7/2007 | Kanai et al. |
| 2007/0182663 | A1 | 8/2007 | Biech |
| 2007/0198760 | A1 | 8/2007 | Han |
| 2007/0271522 | A1 | 11/2007 | Son et al. |
| 2007/0285401 | A1 | 12/2007 | Ohki et al. |
| 2007/0288941 | A1 | 12/2007 | Dunshea et al. |
| 2008/0024388 | A1 | 1/2008 | Bruce |
| 2008/0057910 | A1 | 3/2008 | Thoresson et al. |
| 2008/0062625 | A1 | 3/2008 | Batio |
| 2008/0071595 | A1 | 3/2008 | Chang et al. |
| 2008/0082815 | A1 | 4/2008 | Kawano et al. |
| 2008/0090525 | A1 | 4/2008 | Joo |
| 2008/0119237 | A1 | 5/2008 | Kim |
| 2008/0119731 | A1 | 5/2008 | Becerra et al. |
| 2008/0126762 | A1 | 5/2008 | Kelley et al. |
| 2008/0134061 | A1 | 6/2008 | Banerjee et al. |
| 2008/0155103 | A1 | 6/2008 | Bailey |
| 2008/0244599 | A1 | 10/2008 | Hodson et al. |
| 2008/0282181 | A1 | 11/2008 | Ferguson |
| 2008/0291283 | A1 | 11/2008 | Achiwa et al. |
| 2008/0299951 | A1 | 12/2008 | Karkanias et al. |
| 2009/0037649 | A1 | 2/2009 | Xu |
| 2009/0055749 | A1 | 2/2009 | Chatterjee et al. |
| 2009/0083829 | A1 | 3/2009 | Peterson |
| 2009/0089569 | A1 | 4/2009 | Baribault et al. |
| 2009/0100429 | A1 | 4/2009 | Thoelke et al. |
| 2009/0109468 | A1 | 4/2009 | Barclay et al. |
| 2009/0119580 | A1 | 5/2009 | Rohrabaugh et al. |
| 2009/0138818 | A1 | 5/2009 | Nemoto |
| 2009/0158299 | A1 | 6/2009 | Carter |

(56) References Cited

U.S. PATENT DOCUMENTS

| | | |
|---|---|---|
| 2009/0164930 A1 | 6/2009 | Chen et al. |
| 2009/0176571 A1* | 7/2009 | Sternberg .................. 463/36 |
| 2009/0217071 A1 | 8/2009 | Huang et al. |
| 2009/0219254 A1 | 9/2009 | Lai et al. |
| 2009/0249247 A1 | 10/2009 | Tseng et al. |
| 2009/0249331 A1 | 10/2009 | Davis et al. |
| 2009/0257657 A1 | 10/2009 | Temmermans et al. |
| 2009/0278806 A1 | 11/2009 | Duarte et al. |
| 2009/0298546 A1 | 12/2009 | Kim et al. |
| 2009/0305743 A1 | 12/2009 | Gouesbet et al. |
| 2009/0313440 A1 | 12/2009 | Kim et al. |
| 2009/0322690 A1 | 12/2009 | Hiltunen et al. |
| 2009/0327560 A1 | 12/2009 | Yalovsky |
| 2010/0005396 A1 | 1/2010 | Nason et al. |
| 2010/0007603 A1 | 1/2010 | Kirkup |
| 2010/0013863 A1 | 1/2010 | Harris |
| 2010/0037166 A1 | 2/2010 | Chandrasekar et al. |
| 2010/0046026 A1 | 2/2010 | Heo |
| 2010/0049775 A1 | 2/2010 | Rajawat |
| 2010/0060549 A1 | 3/2010 | Tsern |
| 2010/0063994 A1 | 3/2010 | Cook et al. |
| 2010/0064228 A1 | 3/2010 | Tsern |
| 2010/0064244 A1 | 3/2010 | Kilpatrick et al. |
| 2010/0064536 A1 | 3/2010 | Caskey et al. |
| 2010/0066763 A1 | 3/2010 | Macdougall et al. |
| 2010/0079355 A1 | 4/2010 | Kilpatrick, II et al. |
| 2010/0085274 A1 | 4/2010 | Kilpatrick et al. |
| 2010/0085301 A1 | 4/2010 | Cohen et al. |
| 2010/0085382 A1 | 4/2010 | Lundqvist et al. |
| 2010/0097386 A1 | 4/2010 | Kim et al. |
| 2010/0107163 A1 | 4/2010 | Lee |
| 2010/0110480 A1 | 5/2010 | Satake |
| 2010/0122271 A1 | 5/2010 | Labour et al. |
| 2010/0149121 A1 | 6/2010 | Alexander et al. |
| 2010/0157518 A1 | 6/2010 | Ladouceur et al. |
| 2010/0164836 A1 | 7/2010 | Liberatore |
| 2010/0177019 A1 | 7/2010 | Jeong et al. |
| 2010/0177047 A1 | 7/2010 | Brenneman et al. |
| 2010/0182265 A1 | 7/2010 | Kim et al. |
| 2010/0207903 A1 | 8/2010 | Kim et al. |
| 2010/0211769 A1 | 8/2010 | Shankar et al. |
| 2010/0227650 A1 | 9/2010 | Kim et al. |
| 2010/0245256 A1 | 9/2010 | Estrada et al. |
| 2010/0246119 A1 | 9/2010 | Collopy et al. |
| 2010/0250975 A1 | 9/2010 | Gill et al. |
| 2010/0251233 A1 | 9/2010 | Majewski et al. |
| 2010/0319008 A1 | 12/2010 | Ho |
| 2010/0321275 A1 | 12/2010 | Hinckley et al. |
| 2011/0012858 A1 | 1/2011 | Brookes et al. |
| 2011/0016299 A1 | 1/2011 | Galicia et al. |
| 2011/0016301 A1 | 1/2011 | Galicia et al. |
| 2011/0018901 A1 | 1/2011 | Boorman et al. |
| 2011/0025625 A1 | 2/2011 | Hirako |
| 2011/0034214 A1 | 2/2011 | Hong et al. |
| 2011/0063192 A1 | 3/2011 | Miller et al. |
| 2011/0093691 A1 | 4/2011 | Galicia et al. |
| 2011/0093836 A1 | 4/2011 | Galicia et al. |
| 2011/0096014 A1 | 4/2011 | Fuyuno et al. |
| 2011/0102314 A1 | 5/2011 | Roux |
| 2011/0113329 A1 | 5/2011 | Pusateri |
| 2011/0115713 A1 | 5/2011 | Altman et al. |
| 2011/0115737 A1 | 5/2011 | Fuyuno et al. |
| 2011/0126216 A1 | 5/2011 | Galicia et al. |
| 2011/0167492 A1 | 7/2011 | Ghosh et al. |
| 2011/0193806 A1 | 8/2011 | Kim et al. |
| 2011/0209102 A1 | 8/2011 | Hinckley et al. |
| 2011/0210922 A1 | 9/2011 | Griffin |
| 2011/0216064 A1 | 9/2011 | Dahl et al. |
| 2011/0225538 A1 | 9/2011 | Oyagi et al. |
| 2011/0239142 A1 | 9/2011 | Steeves et al. |
| 2011/0246904 A1 | 10/2011 | Pinto et al. |
| 2011/0260997 A1 | 10/2011 | Ozaki |
| 2011/0267478 A1 | 11/2011 | Jacobs |
| 2011/0273464 A1 | 11/2011 | Brunner et al. |
| 2011/0273475 A1 | 11/2011 | Herz et al. |
| 2011/0289444 A1 | 11/2011 | Winsky |
| 2011/0291964 A1 | 12/2011 | Chambers et al. |
| 2011/0312349 A1 | 12/2011 | Forutanpour |
| 2012/0005602 A1 | 1/2012 | Anttila et al. |
| 2012/0005691 A1 | 1/2012 | Wong et al. |
| 2012/0026069 A1 | 2/2012 | Ohsaki |
| 2012/0060089 A1 | 3/2012 | Heo et al. |
| 2012/0066581 A1 | 3/2012 | Spalink |
| 2012/0076197 A1 | 3/2012 | Byford et al. |
| 2012/0081278 A1 | 4/2012 | Freedman |
| 2012/0081353 A1 | 4/2012 | Yusupov et al. |
| 2012/0081354 A1 | 4/2012 | Yusupov et al. |
| 2012/0081380 A1 | 4/2012 | Reeves et al. |
| 2012/0081383 A1 | 4/2012 | Reeves et al. |
| 2012/0081396 A1 | 4/2012 | Yusupov et al. |
| 2012/0084480 A1 | 4/2012 | Reeves et al. |
| 2012/0084481 A1 | 4/2012 | Reeves et al. |
| 2012/0084542 A1 | 4/2012 | Reeves et al. |
| 2012/0084675 A1 | 4/2012 | Sirpal et al. |
| 2012/0084697 A1 | 4/2012 | Reeves |
| 2012/0084791 A1 | 4/2012 | Benedek et al. |
| 2012/0084792 A1 | 4/2012 | Benedek et al. |
| 2012/0084793 A1 | 4/2012 | Reeves et al. |
| 2012/0084798 A1 | 4/2012 | Reeves et al. |
| 2012/0086716 A1 | 4/2012 | Reeves et al. |
| 2012/0086717 A1 | 4/2012 | Liu |
| 2012/0089906 A1 | 4/2012 | Reeves et al. |
| 2012/0089992 A1 | 4/2012 | Reeves et al. |
| 2012/0094716 A1 | 4/2012 | Reeves |
| 2012/0172088 A1 | 7/2012 | Kirch et al. |
| 2012/0176413 A1 | 7/2012 | Kulik et al. |
| 2012/0188185 A1 | 7/2012 | Cassar |
| 2012/0278747 A1 | 11/2012 | Abraham et al. |
| 2012/0278750 A1 | 11/2012 | Abraham et al. |
| 2013/0019183 A1 | 1/2013 | Reeves et al. |
| 2013/0024778 A1 | 1/2013 | Reeves et al. |
| 2013/0167159 A1 | 6/2013 | Ricci et al. |
| 2014/0380203 A1 | 12/2014 | Freedman |
| 2015/0009237 A1 | 1/2015 | Sirpal et al. |

FOREIGN PATENT DOCUMENTS

| | | |
|---|---|---|
| JP | 2008-225546 | 9/2008 |
| KR | 1020020092969 | 12/2002 |
| KR | 100578592 | 5/2006 |
| KR | 1020060081997 | 7/2006 |
| KR | 100616157 | 8/2006 |
| KR | 100883208 | 2/2009 |
| KR | 1020100043434 | 4/2010 |
| WO | WO 2006/007589 | 7/2006 |
| WO | WO 2006/075859 | 7/2006 |
| WO | WO 2008/132924 | 11/2008 |
| WO | WO 2012/044510 | 4/2012 |
| WO | WO 2012/044518 | 4/2012 |
| WO | WO 2012/044645 | 4/2012 |
| WO | WO 2012/044738 | 4/2012 |
| WO | WO 2012/044872 | 4/2012 |

OTHER PUBLICATIONS

"Apple iPod and iPhone dock Connector Pinout," AllPinouts, Sep. 27, 2010, 3 pages [www.allpinouts.org/index/php/Apple_iPod,_iPad_and_iPhone_dock].

"How to Install Ubuntu on Your Nexus One/Android!" NexusOneHacks.net, Jul. 6, 2010, 9 pages [nexusonehacks.net/nexus-one-hacks/how-to-install-ubuntu-on-your-android].

Kilpatrick et al., "Securing the X Window System with SELinux," NAI Labs Report No. 03-006, 2003, 33 pages.

Stallman "GNU Operating System: Android and Users' Freedom," Sep. 2, 2013, 4 pages [gnu.org/philosophy/android-and-users-freedom.html].

Official Action for U.S. Appl. No. 13/399,929, mailed Dec. 3, 2013 21 pages.

Official Action for U.S. Appl. No. 12/905,920, mailed Sep. 30, 2013 20 pages.

Final Action for U.S. Appl. No. 13/217,099, mailed Oct. 9, 2013 74 pages.

(56) References Cited

OTHER PUBLICATIONS

Official Action for U.S. Appl. No. 13/217,108, mailed Oct. 11, 2013 13 pages.
Final Action for U.S. Appl. No. 13/251,427, mailed Oct. 21, 2013 17 pages.
Notice of Allowance for U.S. Appl. No. 13/247,166, mailed Nov. 4, 2013 14 pages.
Official Action for U.S. Appl. No. 13/217,130, mailed Sep. 16, 2013 12 pages.
Official Action for U.S. Appl. No. 13/246,671, mailed Nov. 20, 2013 50 pages.
Official Action for U.S. Appl. No. 13/246,675, mailed Sep. 27, 2013 32 pages.
U.S. Appl. No. 13/843,086, filed Mar. 15, 2013, Reeves et al.
Dutko, "Domo Arigato Mr Androidato—An Introduction to the New Google Mobile Linux Framework, Android," Linux Journal, Mar. 2008, vol. 2008, Iss. 167, 9 pages.
Sud, et al., "Dynamic Migration of Computation Through Virtualization of the Mobile Platform," Mobile Networks and Applications, 2012, (published online Feb. 22, 2011), vol. 17, Iss. 2, pp. 206-215.
International Search Report and Written Opinion for International Patent Application No. PCT/US2012/046800, mailed Feb. 20, 2013, 9 pages.
International Search Report and Written Opinion for International Patent Application No. PCT/US2012/046802, mailed Feb. 20, 2013, 9 pages.
International Search Report for International Patent Application No. PCT/US2011/056149, mailed Apr. 24, 2012, 5 pages.
Written Opinion for International Patent Application No. PCT/US2011/056149, mailed Apr. 24, 2012, 4 pages.
International Preliminary Report on Patentability for International Patent Application No. PCT/US2011/056149, mailed Apr. 25, 2013, 6 pages.
International Preliminary Report on Patentability for International (PCT) Patent Application No. PCT/US2011/052822, mailed Apr. 11, 2013 7 pages.
International Preliminary Report on Patentability for International (PCT) Patent Application No. PCT/US2011/052598, mailed Apr. 11, 2013 9 pages.
International Preliminary Report on Patentability for International (PCT) Patent Application No. PCT/US2011/053835, mailed Apr. 11, 2013 6 pages.
International Search Report for International Patent Application No. PCT/US2011/053130, mailed Apr. 24, 2012, 5 pages.
Written Opinion for International Patent Application No. PCT/US2011/053130, mailed Apr. 24, 2012, 4 pages.
International Preliminary Report on Patentability for International Patent Application No. PCT/US2011/053130, mailed Apr. 11, 2013, 6 pages.
International Search Report for International Patent Application No. PCT/US2011/053826, mailed Apr. 27, 2012, 5 pages.
Written Opinion for International Patent Application No. PCT/US2011/053826, mailed Apr. 27, 2012, 4 pages.
International Preliminary Report on Patentability for International Patent Application No. PCT/US2011/053826, mailed Apr. 11, 2013, 6 pages.
International Search Report for International Patent Application No. PCT/US2011/052988, mailed May 3, 2012, 5 pages.
Written Opinion for International Patent Application No. PCT/US2011/052988, mailed May 3, 2012, 4 pages.
International Preliminary Report on Patentability for International Patent Application No. PCT/US2011/052988, mailed Apr. 11, 2013, 6 pages.
International Search Report for International Patent Application No. PCT/US2011/054605, mailed Apr. 30, 2012, 5 pages.
Written Opinion for International Patent Application No. PCT/US2011/054605, mailed Apr. 30, 2012, 5 pages.
International Preliminary Report on Patentability for International Patent Application No. PCT/US2011/054605, mailed Apr. 11, 2013, 7 pages.
International Search Report for International Patent Application No. PCT/US2011/053909, mailed Apr. 30, 2012, 5 pages.
Written Opinion for International Patent Application No. PCT/US2011/053909, mailed Apr. 30, 2012, 4 pages.
International Preliminary Report on Patentability for International Patent Application No. PCT/US2011/053909, mailed Apr. 11, 2013, 6 pages.
International Search Report for International Patent Application No. PCT/US2011/054623, mailed Apr. 27, 2012, 5 pages.
Written Opinion for International Patent Application No. PCT/US2011/054623, mailed Apr. 27, 2012, 4 pages.
International Preliminary Report on Patentability for International Patent Application No. PCT/US2011/054623, mailed Apr. 11, 2013, 6 pages.
International Search Report for International Patent Application No. PCT/US2011/053037, mailed Mar. 20, 2012, 5 pages.
Written Opinion for International Patent Application No. PCT/US2011/053037, mailed Mar. 20, 2012, 6 pages.
International Preliminary Report on Patentability for International Patent Application No. PCT/US2011/053037, mailed Apr. 11, 2013, 8 pages.
International Search Report for International Patent Application No. PCT/US2011/053923, mailed Apr. 30, 2012, 5 pages.
Written Opinion for International Patent Application No. PCT/US2011/053923, mailed Apr. 30, 2012, 4 pages.
International Preliminary Report on Patentability for International Patent Application No. PCT/US2011/053923, mailed Apr. 11, 2013, 6 pages.
International Search Report for International Patent Application No. PCT/US2011/054017, mailed Apr. 24, 2012, 5 pages.
Written Opinion for International Patent Application No. PCT/US2011/054017, mailed Apr. 24, 2012, 4 pages.
International Preliminary Report on Patentability for International Patent Application No. PCT/US2011/054017, mailed Apr. 11, 2013, 6 pages.
International Preliminary Report on Patentability for International (PCT) Patent Application No. PCT/US2011/054105, mailed Apr. 11, 2013 5 pages.
International Preliminary Report on Patentability for International (PCT) Patent Application No. PCT/US2011/053585, mailed Apr. 11, 2013 6 pages.
International Search Report for International Patent Application No. PCT/US2011/053665, mailed Apr. 30, 2012, 5 pages.
Written Opinion for International Patent Application No. PCT/US2011/053665, mailed Apr. 30, 2012, 4 pages.
International Preliminary Report on Patentability for International Patent Application No. PCT/US2011/053665, mailed Apr. 11, 2013, 6 pages.
International Search Report for International Patent Application No. PCT/US2011/053691, mailed May 4, 2012, 5 pages.
Written Opinion for International Patent Application No. PCT/US2011/053691, mailed May 4, 2012, 4 pages.
International Preliminary Report on Patentability for International Patent Application No. PCT/US2011/053691, mailed Apr. 11, 2013, 6 pages.
International Search Report for International Patent Application No. PCT/US2011/054019, mailed Apr. 10, 2012, 5 pages.
Written Opinion for International Patent Application No. PCT/US2011/054019, mailed Apr. 10, 2012, 4 pages.
International Preliminary Report on Patentability for International Patent Application No. PCT/US2011/054019, mailed Apr. 11, 2013, 6 pages.
International Search Report for International Patent Application No. PCT/US2011/053127, mailed Apr. 24, 2012, 5 pages.
Written Opinion for International Patent Application No. PCT/US2011/053127, mailed Apr. 24, 2012, 4 pages.
International Preliminary Report on Patentability for International Patent Application No. PCT/US2011/053127, mailed Apr. 11, 2013, 6 pages.
Official Action for U.S. Appl. No. 13/247,719, mailed Mar. 29, 2013 16 pages.
Official Action for U.S. Appl. No. 13/247,719, mailed Aug. 16, 2013 20 pages.

(56) References Cited

OTHER PUBLICATIONS

Official Action for U.S. Appl. No. 13/484,951, mailed Mar. 11, 2013 11 pages.
Official Action for U.S. Appl. No. 13/484,951, mailed Jul. 25, 2013 12 pages.
Official Action for U.S. Appl. No. 13/399,901, mailed Aug. 2, 2013 17 pages.
Official Action for U.S. Appl. No. 12/905,920 mailed Dec. 7, 2012, 13 pages.
Official Action for U.S. Appl. No. 12/905,920 mailed Mar. 15, 2012, 12 pages.
Official Action for U.S. Appl. No. 12/905,920 mailed Jul. 3, 2012, 14 pages.
Official Action for U.S. Appl. No. 12/905,920 mailed Apr. 25, 2013, 16 pages.
Official Action for U.S. Appl. No. 12/948,686, mailed Jul. 26, 2013 11 pages.
Official Action for U.S. Appl. No. 12/948,701, mailed Jun. 7, 2013 16 pages.
Official Action for U.S. Appl. No. 13/246,665, mailed Apr. 24, 2013 30 pages.
Official Action for U.S. Appl. No. 246,665, mailed Aug. 28, 2013 33 pages.
Official Action for U.S. Appl. No. 13/217,099 mailed Apr. 10, 2013, 53 pages.
Official Action for U.S. Appl. No. 13/247,885 mailed Mar. 19, 2013, 19 pages.
Notice of Allowance for U.S. Appl. No. 13/247,885, mailed Aug. 29, 2013 12 pages.
Official Action for U.S. Appl. No. 13/251,427 mailed Feb. 15, 2013, 18 pages.
Official Action for U.S. Appl. No. 13/247,166 mailed Mar. 21, 2013, 4 pages Restriction Requirement.
Official Action for U.S. Appl. No. 13/247,166 mailed Jul. 2, 2013 12 pages.
Official Action for U.S. Appl. No. 13/217,130 mailed Mar. 15, 2013, 12 pages.
Official Action for U.S. Appl. No. 13/247,170 mailed Apr. 11, 2013, 36 pages.
Official Action for U.S. Appl. No. 13/247,170, mailed Aug. 5, 2013 34 pages.
Official Action for U.S. Appl. No. 13/246,669 mailed Jan. 8, 2013, 14 pages.
Official Action for U.S. Appl. No. 13/246,699, mailed Jul. 12, 2013 18 pages.
Notice of Allowance for U.S. Appl. No. 13/246,669, mailed Sep. 11, 2013 16 pages.
Official Action for U.S. Appl. No. 13/246,671, mailed Mar. 27, 2013 34 pages.
Official Action for U.S. Appl. No. 13/246,671, mailed Jul. 15, 2013.
Official Action for U.S. Appl. No. 13/246,128 mailed May 10, 2013, 40 pages.
Official Action for U.S. Appl. No. 13/246,128 mailed Aug. 23, 2013 46 pages.
Official Action for U.S. Appl. No.. 13/246,133 mailed Apr. 16, 2013, 25 pages.
Official Action for U.S. Appl. No. 13/246,133, mailed Aug. 23, 2013 32 pages.
Official Action for U.S. Appl. No. 13/246,675 mailed May 1, 2013, 27 pages.
Official Action for U.S. Appl. No. 13/217,121 mailed Mar. 6, 2013, 11 pages.
Official Action for U.S. Appl. No. 13/217,121, mailed Aug. 1, 2013 11 pages.
Official Action for U.S. Appl. No. 13/399,936, mailed Sep. 10, 2013 23 pages.
U.S. Appl. No. 13/187,026, filed Jul. 20, 2011, Chen.
U.S. Appl. No. 13/399,901, filed Feb. 17, 2012, Reeves et al.
U.S. Appl. No. 13/484,951, filed May 31, 2012, Sirpal et al.
U.S. Appl. No. 13/485,734, filed May 31, 2012, Reeves et al.
U.S. Appl. No. 13/624,565, filed Sep. 21, 2012, Sirpal et al.
U.S. Appl. No. 13/628,380, filed Sep. 27, 2012, Reeves.
U.S. Appl. No. 13/628,170, filed Sep. 27, 2012, Kretz.
U.S. Appl. No. 13/628,234, filed Sep. 27, 2012, Kretz.
U.S. Appl. No. 13/629,415, filed Sep. 27, 2012, Reeves.
U.S. Appl. No. 13/628,949, filed Sep. 27, 2012, Reeves et al.
Burns, C., "Motorola ATRIX 4G Laptop Dock Review," at www.androidcommunity.com/motorola-atrix-4g-laptop-dock-review-20110220/, Feb. 20, 2011, 5 pages.
Catacchio, Chad, "This smartphone has two huge screens . . . that rotate," The Next Web at www.thenextweb.com/asia/2010/10/07/this-smartphone-has-two-huge-screens-that-rotate/, Jul. 21, 2011, 2 pages.
Google images, accessed Apr. 18, 2011, 6 pages.
Google Transliteration IME website, 2010, available at www.google.com/ime/transliteration/help.html#features, 8 pages.
Harman03, "Kyocera Echo Dual-screen Android Phone," posted 4 weeks from Apr. 18, 2011, 3 pages.
InputKing Online Input System, 2011, available at www.inputking.com, 2 pages.
"Lapdock™ for Motorola ATRIX," at www.motorola.com/Consumers/US-EN/Consumer-Product-and-Services/Mobile . . . , accessed Apr. 18, 2011, 1 page.
"Motorola ATRIX 4G Laptop Dock Review," at www.phonearena.com/reviews/Motorola-ATRIX-4G-Laptop-Dock-Review_id2667, Mar. 2, 2011, 6 pages.
SAKHR Software—Arabic Optical Character Recognition, Jul. 15, 2011, available at www.sakhr.com/ocr.aspx, 1 page.
Stein, S., "How does the Motorola Atrix 4G Lapdock compare with a laptop?" Crave—CNET, at www.news.cnet.com/8301-17938_105-20031251-1.html, Feb. 9, 2011, 7 pages.
Website entitled, "Kyocera Echo," at www.echobykyocera.com/, 2011, 6 pages.
Website entitled, "Sony Tablet," at www.store.sony.com/webapp/wcs/stores/servlet/CategoryDisplay?catalogId=10551&storeId=10151&langId=-1&categoryId=8198552921644795521, 2011, 3 pages.
Wikipedia, "Balloon help," Jul. 18, 2011, available at www.en.wikipedia.org/wiki/Balloon_help, 3 pages.
Wikipedia, "Google Pinyin," Aug. 27, 2011 available at www.en.wikipedia.org/wiki/Google_Pinyin, 3 pages.
Wikipedia, "Mouseover," Sep. 29, 2011, available at www.en.wikipedia.org/wiki/Mouseover, 2 pages.
Wikipedia, "Predictive text," Aug. 7, 2011, available at www.en.wikipedia.org/wiki/Predictive_test, 6 pages.
Wikipedia, "Sogou Pinyin," Jul. 23, 2011 available at www.en.wikipedia.org/wiki/Sogou_Pinyin, 3 pages.
Wikipedia, "Status bar," Sep. 8, 2011, available at www.en.wikipedia.org/wiki/Status_bar, 3 pages.
Wikipedia, "Tooltip," Sep. 17, 2011, available at www.en.wikipedia.org/wiki/Tooltip, 2 pages.
International Search Report for International Patent Application No. PCT/US11/52822, mailed Apr. 27, 2012, 5 pages.
International Search Report for International Patent Application No. PCT/US11/52598, mailed Mar. 27, 2012, 3 pages.
International Search Report for International Patent Application No. PCT/US11/53835, mailed Apr. 30, 2012, 5 pages.
Written Opinion for International Patent Application No. PCT/US11/53835, mailed Apr. 30, 2012, 4 pages.
International Search Report for International Patent Application No. PCT/US11/54105, mailed Apr. 30, 2012, 3 pages.
International Search Report for International Patent Application No. PCT/US11/53585, mailed May 4, 2012, 3 pages.
Official Action for U.S. Appl. No. 13/484,951, mailed Aug. 17, 2012, 13 pages.
Haselton, "Celio Announces Redfly Smart Phone Dock, Software for Windows PCs," Laptop Magazine, Jan. 8, 2009, [retrieved on Feb. 11, 2014], 4 pages. Retrieved from: blog.laptopmag.com/redfly-launches-smartphone-dock-software-for-windows-pcs.
McDermott "Porting Android to a new device," Embedded Software, Jan. 28, 2010, 12 pages [retrieved from: http://yidonghan.wordpress.com/2010/01/28/porting-android-to-a-new-device/].

(56) References Cited

OTHER PUBLICATIONS

Rebecka & Zingo, "Share memory using ashmem and binder in the android framework," Andoid Blog, Mar. 22, 2010, 14 pages [retrived from: http://www.androidenea.com/2010/03/share-memory-using-ashmem-and-binder-in.html].
International Search Report for International (PCT) Patent Application No. PCT/US2012/046798, mailed Feb. 20, 2013 3 pages.
International Preliminary Report on Patentability for International (PCT) Patent Application No. PCT/US2012/046798, mailed Jan. 23, 2014 6 pages.
International Preliminary Report on Patentability for International (PCT) Patent Application No. PCT/US2012/046800, mailed Jan. 23, 2014 6 pages.
International Preliminary Report on Patentability for International Patent Application No. PCT/US2012/046802, mailed Jan. 23, 2014, 6 pages.
Extended Search Report for European Patent Application No. 11829766.2, dated Jan. 8, 2014 11 pages.
Official Action for U.S. Appl. No. 13/484,951, mailed Jan. 30, 2014 12 pages.
Notice of Allowance for U.S. Appl. No. 13/484,951, mailed May 12, 2014 7 pages.
Official Action for U.S. Appl. No. 13/624,565, mailed Jun. 5, 2014 30 pages.
Official Action for U.S. Appl. No. 13/628,380, mailed Jun. 5, 2014 16 pages.
Official Action for U.S. Appl. No. 13/629,415, mailed Apr. 25, 2014 16 pages.
Final Action for U.S. Appl. No. 13/399,901, mailed Dec. 26, 2013 20 pages.
Official Action for U.S. Appl. No. 13/399,901, mailed May 1, 2014 17 pages.
Official Action for U.S. Appl. No. 13/399,936, mailed Feb. 20, 2014 27 pages.
Notice of Allowance for U.S. Appl. No. 12/905,920, mailed Feb. 27, 2014 13 pages.
Official Action for U.S. Appl. No. 12/948,686, mailed Jan. 29, 2014 13 pages.
Notice of Allowance for U.S. Appl. No. 12/948,686, mailed May 9, 2014 7 pages.
Official Action for U.S. Appl. No. 12/948,701, mailed Jun. 3, 2014 19 pages.
Official Action for U.S. Appl. No. 13/246,665, mailed Feb. 27, 2014 38 pages.
Official Action for U.S. Appl. No. 13/217,099, mailed May 29, 2014 73 pages.
Notice of Allowance for U.S. Appl. No. 13/247,885, mailed Jan. 9, 2014 8 pages.
Official Action for U.S. Appl. No. 13/217,108 mailed Feb. 25, 2014, 22 pages.
Official Action for U.S. Appl. No. 13/251,427, mailed May 23, 2014 15 pages.
Official Action for U.S. Appl. No. 13/250,764, mailed Dec. 11, 2013 23 pages.
Official Action for U.S. Appl. No. 13/217,130, mailed Mar. 20, 2014 18 pages.
Official Action for U.S. Appl. No. 13/247,170, mailed Dec. 11, 2013 47 pages.
Official Action for U.S. Appl. No. 13/247,170, mailed Jun. 5, 2014 58 pages.
Notice of Allowance for U.S. Appl. No. 13/246,669, mailed Apr. 11, 2014 11 pages.
Official Action for U.S. Appl. No. 13/246,671, mailed Jun. 5, 2014 60 pages.
Official Action for U.S. Appl. No. 13/246,128, mailed Dec. 26, 2013 43 pages.
Official Action for U.S. Appl. No. 13/246,133, mailed Jan. 15, 2014 37 pages.
Official Action for U.S. Appl. No. 13/246,675, mailed Mar. 7, 2014 34 pages.
Official Action for U.S. Appl. No. 13/217,121, mailed Feb. 10, 2014 12 pages.
Mikeclay, "Launch Multiple Programs at Once Using Simple Batch File," Feb. 5, 2009 available at www.web.archive.org/web/20090205134920/http://www.windowsreference.com/windows-2000/1aunch-multiple-programs-at-once-using-simple-batch-file/, 5 pages.
Official Action for U.S. Appl. No. 12/948,701, mailed Nov. 16, 2012, 16 pages.
Official Action for Mexican Patent Application No. MX/a/2013/003515, mailed Jun. 12, 2014, 3 pages (includes English summary).
Official Action for European Patent Application No. 11829880.1, mailed Aug. 13, 2014, 5 pages.
Official Action for U.S. Appl. No. 13/247,719, mailed Aug. 29, 2014 21 pages.
Official Action for U.S. Appl. No. 13/624,565, mailed Oct. 14, 2014 36 pages.
Official Action for U.S. Appl. No. 13/628,380, mailed Sep. 12, 2014 16 pages.
Official Action for U.S. Appl. No. 13/628,234, mailed Sep. 12, 2014 9 pages.
Official Action for U.S. Appl. No. 13/628,949, mailed Oct. 9, 2014 11 pages.
Official Action for U.S. Appl. No. 13/399,929, mailed Jun. 18, 2014 35 pages.
Notice of Allowance for U.S. Appl. No. 13/399,936, mailed Sep. 15, 2014 11 pages.
Official Action for U.S. Appl. No. 13/246,665, mailed Jun. 12, 2014 39 pages.
Official Action for U.S. Appl. No. 14/068,662, mailed Jul. 28, 2014 26 pages.
Official Action for U.S. Appl. No. 13/217,108, mailed Jun. 20, 2014 18 pages.
Notice of Allowance for U.S. Appl. No. 13/217,108, mailed Jul. 11, 2014 7 pages.
Official Action for U.S. Appl. No. 13/250,764, mailed Jul. 1, 2014 26 pages.
Official Action for U.S. Appl. No. 13/217,130, mailed Aug. 5, 2014 19 pages.
Notice of Allowance for U.S. Appl. No. 13/247,170, mailed Sep. 23, 2014 11 pages.
Notice of Allowance for U.S. Appl. No. 13/246,671, mailed Sep. 25, 2014 9 pages.
Official Action for U.S. Appl. No. 13/246,118, mailed Oct. 8, 2014 10 pages.
Official Action for U.S. Appl. No. 13/246,128, mailed Jun. 13, 2014 50 pages.
Official Action for U.S. Appl. No. 13/246,133, mailed Jun. 13, 2014 44 pages.
Notice of Allowance for U.S. Appl. No. 13/246,675, mailed Jul. 29, 2014 9 pages.
Official Action for U.S. Appl. No. 13/217,121, mailed Jun. 12, 2014 13 pages.
U.S. Appl. No. 14/539,016, filed Nov. 12, 2014, Reeves et al.
Notice of Allowance for Mexican Patent Application No. MX/a/2013/003515, mailed Nov. 5, 2014, 1 page.
European Extended Search Report for European Patent Application No. 11829880.1, mailed Dec. 5, 2014, 10 pages.
Notice of Allowance for Mexican Patent Application No. MX/a/2013/003427, mailed Nov. 26, 2014, 1 page.
Notice of Allowance for U.S. Appl. No. 14/498,330, mailed Oct. 27, 2014 8 pages.
Official Action for U.S. Appl. No. 13/624,565, mailed Jan. 8, 2015 47 pages.
Official Action for U.S. Appl. No. 13/628,380, mailed Jan. 2, 2015 18 pages.
Official Action for U.S. Appl. No. 13,628,170, mailed Nov. 3, 2014 9 pages.
Official Action for U.S. Appl. No. 13/629,415, mailed Dec. 3, 2014 22 pages.
Official Action for U.S. Appl. No. 13/399,901, mailed Oct. 29, 2014 23 pages.

(56) References Cited

OTHER PUBLICATIONS

Official Action for U.S. Appl. No. 12/948,701, mailed Dec. 15, 2014 19 pages.
Notice of Allowance for U.S. Appl. No. 13/246,665, mailed Jan. 13, 2015 9 pages.
Official Action for U.S. Appl. No. 13/217,099, mailed Dec. 1, 2014 82 pages.
Notice of Allowance for U.S. Appl. No. 14/068,662, mailed Jan. 12, 2015 15 pages.
Official Action for U.S. Appl. No. 13/251,427, mailed Dec. 8, 2014 17 pages.
Notice of Allowance for U.S. Appl. No. 13/250,764, mailed Dec. 4, 2014 8 pages.
Notice of Allowance for U.S. Appl. No. 13/217,130, mailed Dec. 3, 2014 5 pages.
Notice of Allowance for U.S. Appl. No. 13/246,133, mailed Jan. 21, 2015 10 pages.
Official Action for U.S. Appl. No. 13/217,121, mailed Dec. 18, 2014 15 pages.

* cited by examiner

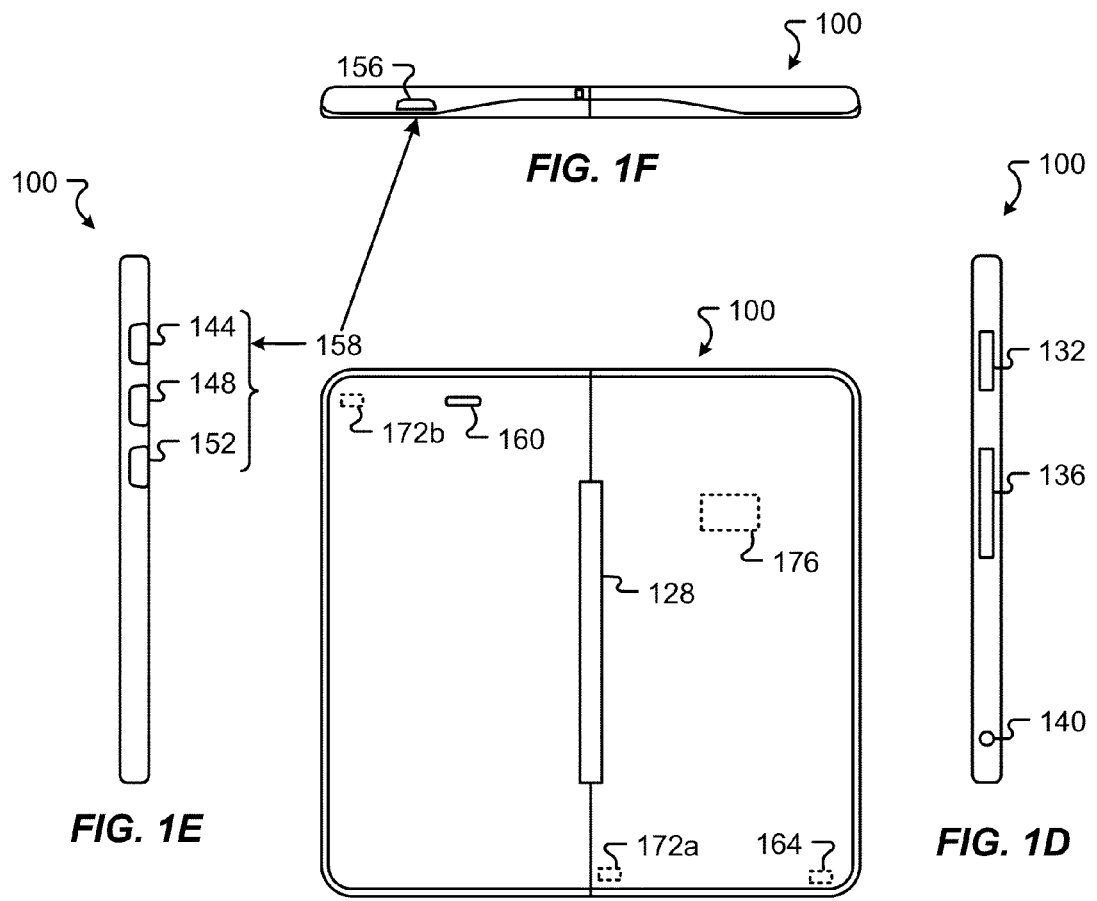
FIG. 1F
FIG. 1E
FIG. 1C
FIG. 1D
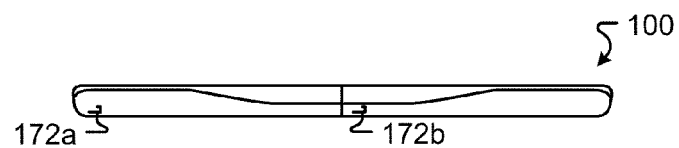
FIG. 1G

|  |  | PORTRAIT | | | | | LANDSCAPE | | | | |
|---|---|---|---|---|---|---|---|---|---|---|---|
|  |  | OPEN | CLOSED | EASEL | MODIFIED EASEL | PHONE | IMAGE / VIDEO | OPEN | CLOSED | EASEL | MODIFIED EASEL | PHONE | IMAGE / VIDEO |
| P O R T R A I T | OPEN | X | HT | HT | HT | P | I | AT | HAT | HAT | HAT | P | I |
|  | CLOSED | HT | X | HAT | HAT | P | I | HAT | AT | HAT | HAT | P | I |
|  | EASEL | HT | HT | X | X | P | I | HAT | HAT | HAT | HAT | P | I |
|  | PHONE | HT | X | HT | HT | X | X | HAT | HAT | HAT | HAT | X | HAT |
|  | IMAGE / VIDEO | HT | HT | HT | X | P | X | HAT | HAT | HAT | HAT | X | |
| L A N D S C A P E | OPEN | AT | HAT | HAT | HAT | P | I | X | HT | HAT | HAT | P | I |
|  | CLOSED | HAT | AT | HAT | HAT | P | I | HT | X | X | HAT | P | I |
|  | EASEL | HAT | HAT | HAT | HAT | P | I | HT | HT | HAT | HAT | P | I |
|  | MODIFIED EASEL | HAT | HAT | HAT | HAT | HAT | AT | HT | HT | HT | X | P | X |
|  | IMAGE / VIDEO | HAT | HAT | HAT | HAT | P | X | HT | HT | HT | HAT | P | |
| DOCKED | | | | | | | | DOCKING SIGNAL | | | | | |

Key:
H - Hall Effect Sensor(s)
a - accelerometer(s)
T - Timer
P – communications Trigger
I – Image / Video capture Request

*FIG. 3B*

Tap

Long Press

Drag

Flick

Pinch

Spread

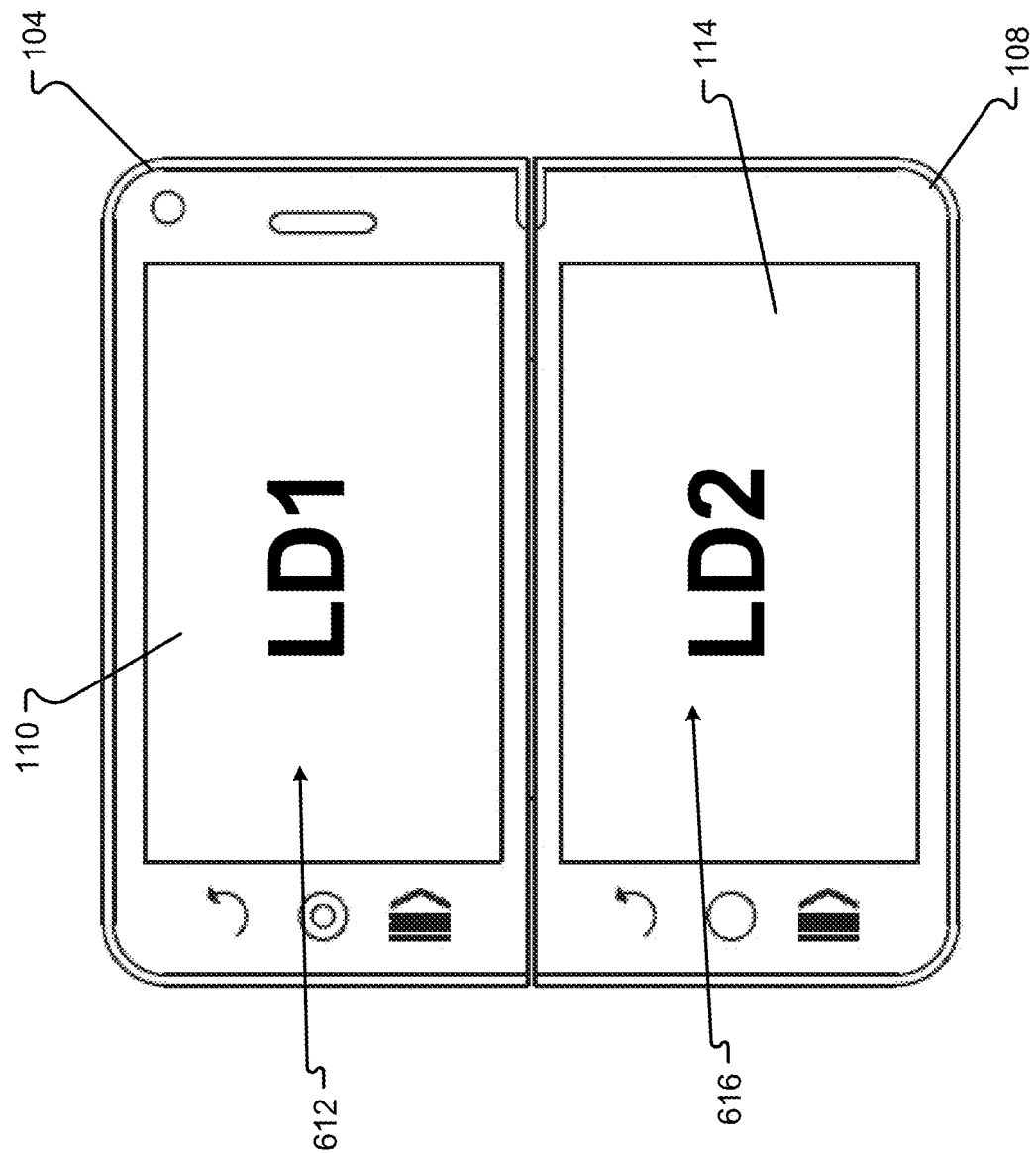

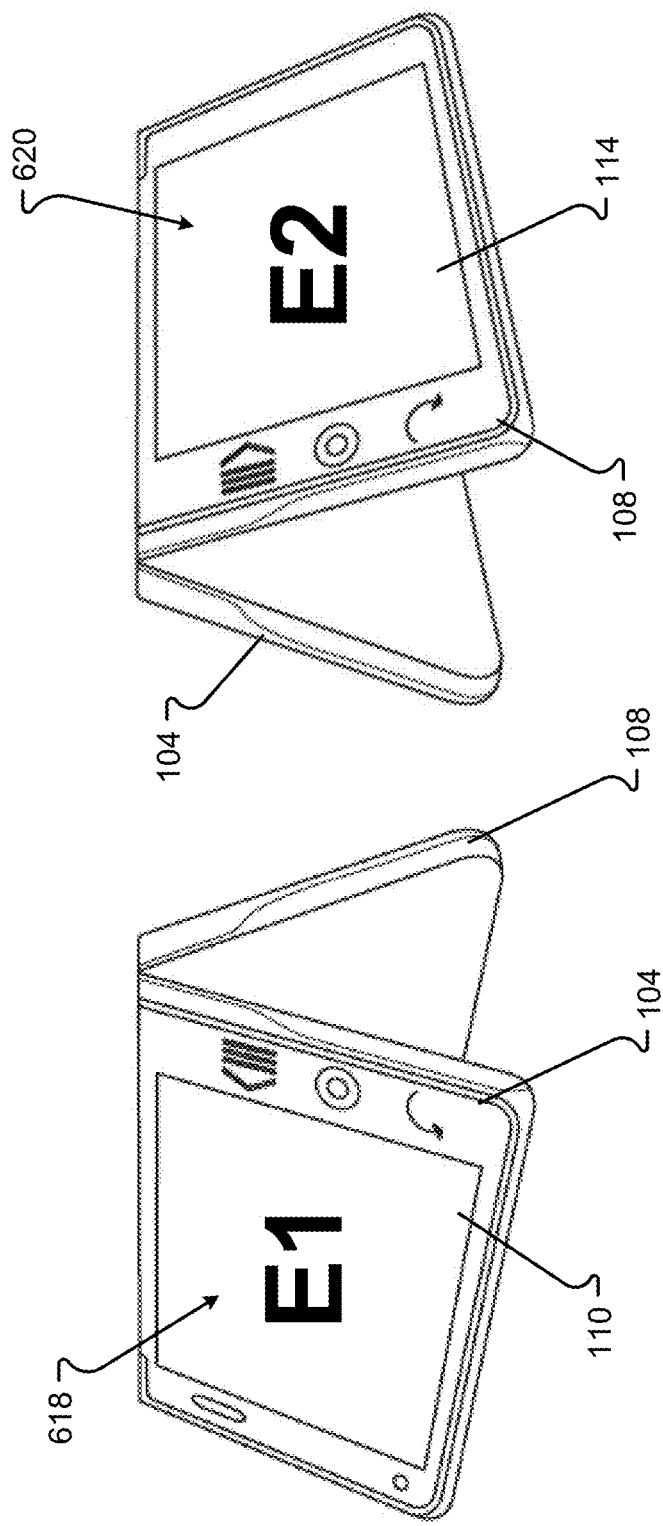

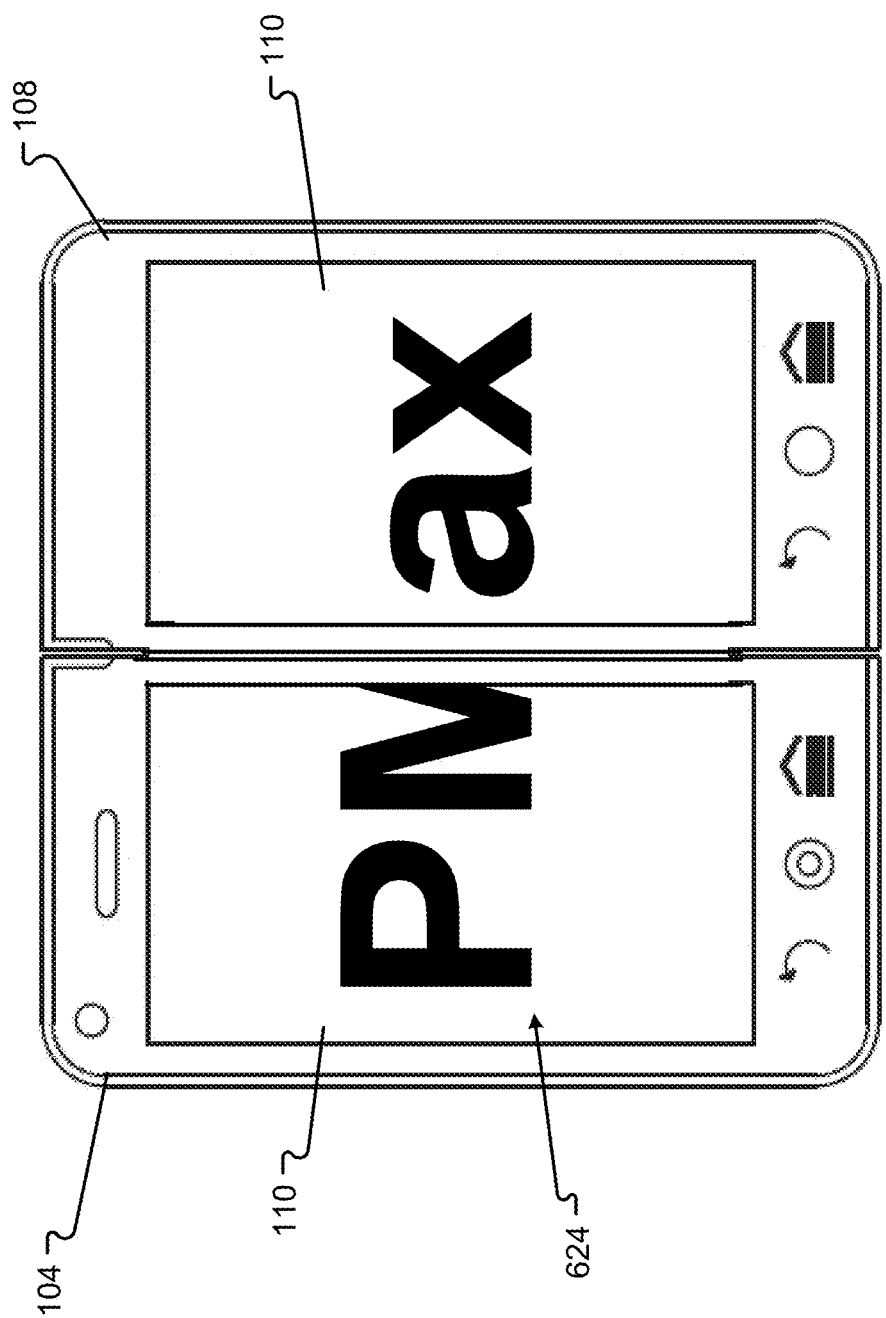

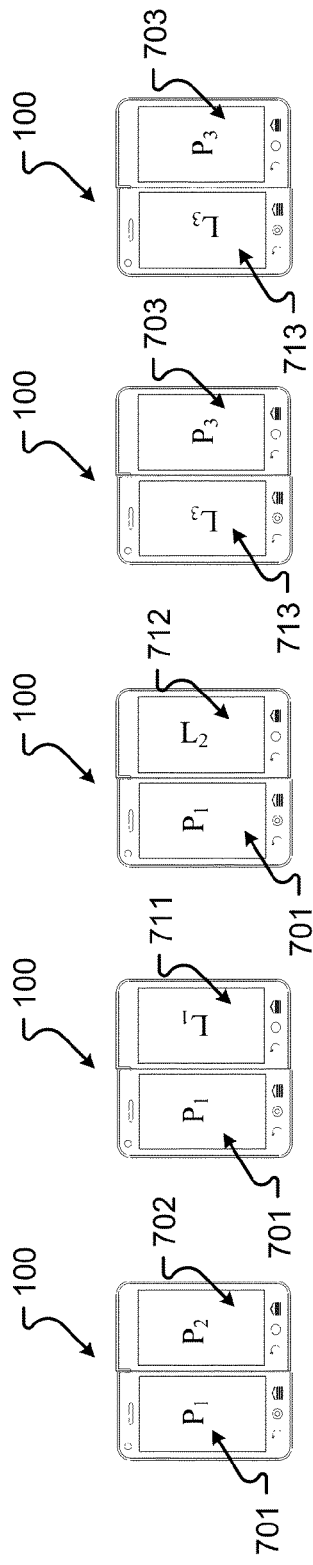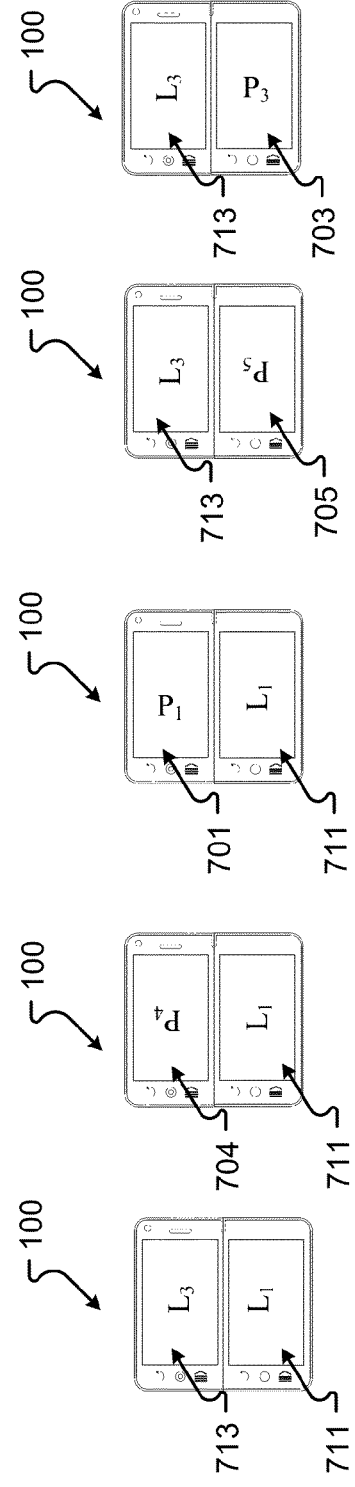

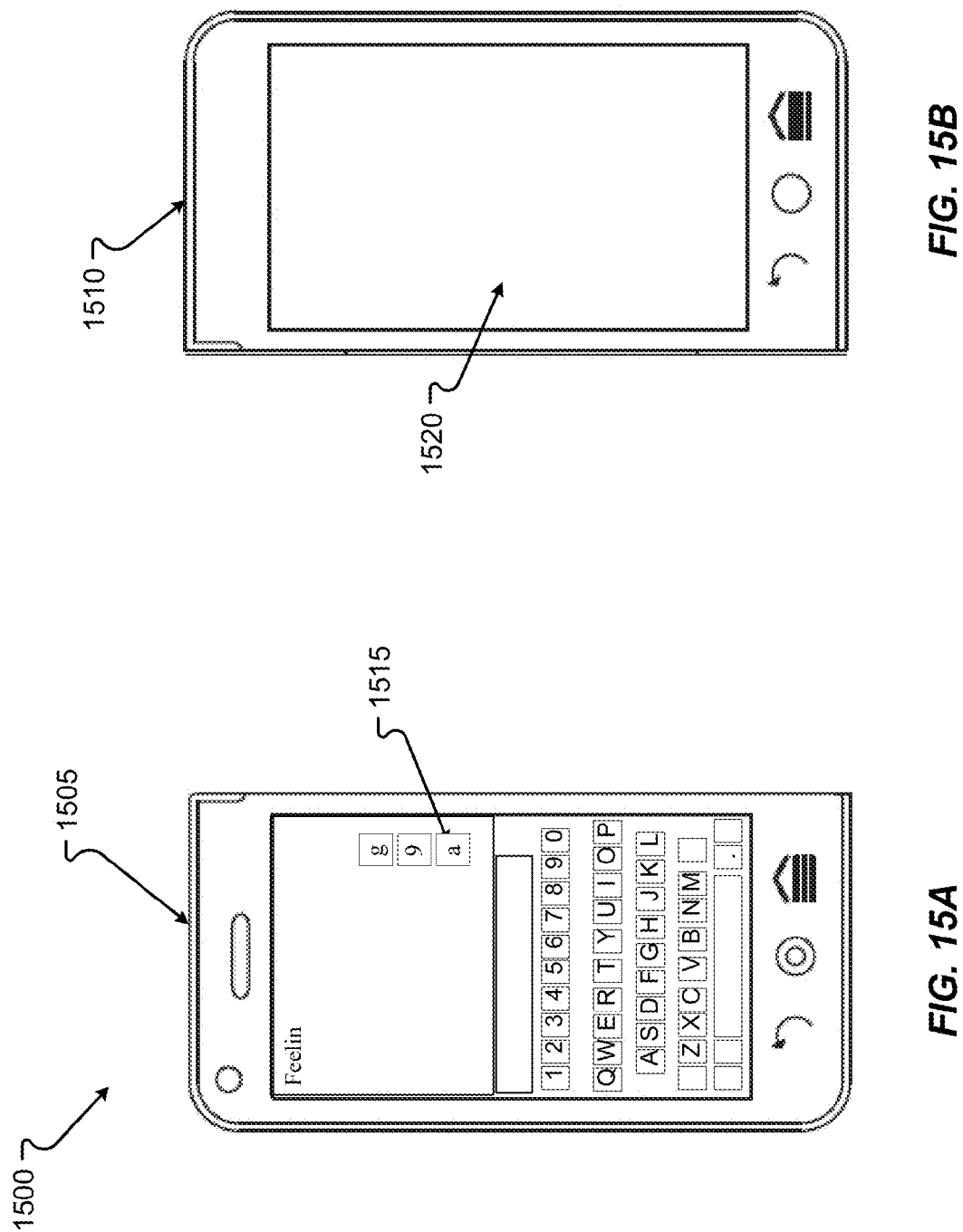

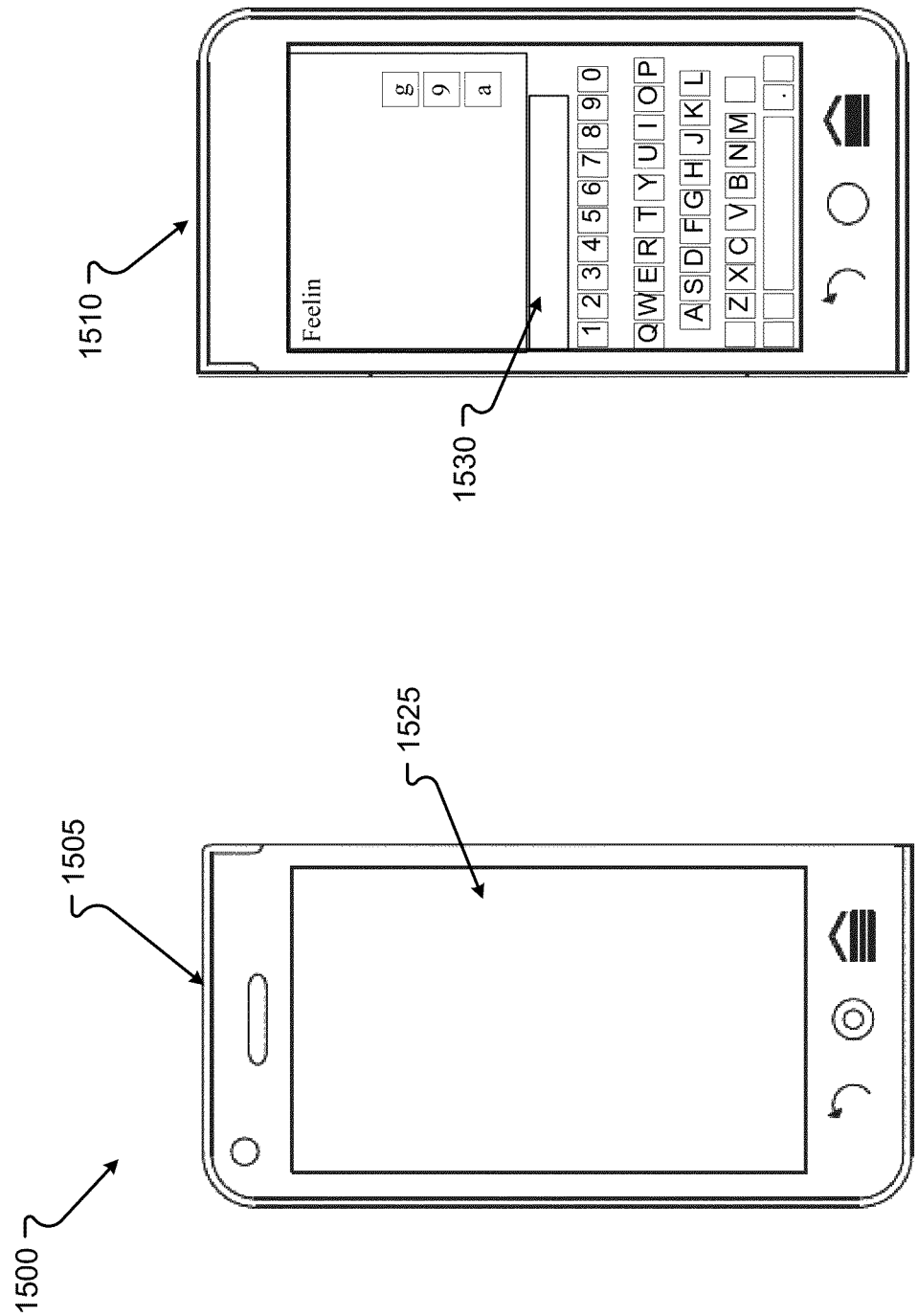

SEPARATION OF SCREEN USAGE FOR COMPLEX LANGUAGE INPUT

CROSS REFERENCE TO RELATED APPLICATION

The present application claims the benefits of and priority, under 35 U.S.C. §119(e), to U.S. Provisional Application Ser. No. 61/539,884, filed Sep. 27, 2011, entitled "MOBILE DEVICE." The present application also cross-references U.S. patent application Ser. No. 13/362,789, filed Jan. 31, 2012, entitled "SECONDARY SINGLE SCREEN MODE ACTIVATION THROUGH OFF-SCREEN GESTURE AREA ACTIVATION" and U.S. patent application Ser. No. 13/485,734, filed May 31, 2012, entitled "UNIFIED DESKTOP WAKE AND UNLOCK." These applications are each incorporated herein by reference in their entireties for all that they teach and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

Additionally, it is desirable to have methods including providing a device having at least a primary screen and a secondary screen; receiving a first input, where the first input includes a language input on the primary screen; processing the first input to estimate a character based on the first input; displaying the estimated character(s); and displaying a selection, where the selection includes a chosen character selected from the estimated character(s).

Additionally, it is desirable to have devices that include a primary screen; a secondary screen; a memory; a processor in communication with the memory, the primary screen, and the secondary screen, the processor operable to receive a first input, where the first input includes a language input on the primary screen; process the first input to estimate a character based on the first input; display the estimated character(s); and display a selection, where the selection includes a chosen character selected from the estimated character(s).

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composite display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" or "multiple-display application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application may not be capable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6F is a sixth representation of an embodiment of a device configuration generated in response to the device state;

FIG. 6G is a seventh representation of an embodiment of a device configuration generated in response to the device state;

FIG. 6H is a eighth representation of an embodiment of a device configuration generated in response to the device state;

FIG. 6I is a ninth representation of an embodiment of a device configuration generated in response to the device state;

FIG. 7A is a representation of an embodiment of a dual-screen device presenting both display screens in portrait orientation;

FIG. 7B is another representation of an embodiment of a dual-screen device presenting one display screen in portrait orientation and the other display screen in landscape orientation;

FIG. 7C is another representation of an embodiment of a dual-screen device presenting one display screen in portrait orientation and the other display screen in landscape orientation;

FIG. 7D is another representation of an embodiment of a dual-screen device presenting one display screen in portrait orientation and the other display screen in landscape orientation;

FIG. 7E is another representation of an embodiment of a dual-screen device presenting one display screen in portrait orientation and the other display screen in landscape orientation;

FIG. 7F is a representation of an embodiment of a dual-screen device presenting both display screens in landscape orientation;

FIG. 7G is another representation of an embodiment of a dual-screen device presenting one display screen in portrait orientation and the other display screen in landscape orientation;

FIG. 7H is another representation of an embodiment of a dual-screen device presenting one display screen in portrait orientation and the other display screen in landscape orientation;

FIG. 7I is another representation of an embodiment of a dual-screen device presenting one display screen in portrait orientation and the other display screen in landscape orientation;

FIG. 7J is another representation of an embodiment of a dual-screen device presenting one display screen in portrait orientation and the other display screen in landscape orientation;

FIG. 15A illustrates an exemplary user interface for a primary screen;

FIG. 15B illustrates an exemplary user interface for a secondary or alternate screen;

FIG. 15C illustrates an exemplary user interface for a primary screen; and

FIG. 15D illustrates an exemplary user interface for a secondary or alternate screen.

Figure 1A:
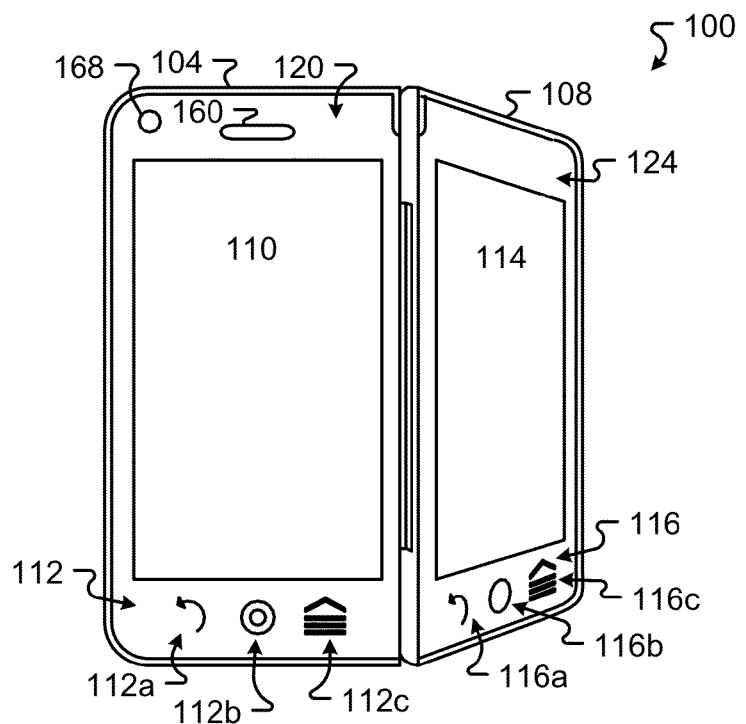
FIG. 1A includes a first view of an embodiment of a multi-screen user device.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112*a* and 116*a* have been configured to receive a "back" input indicating that a user would like to view information previously displayed. Areas 112*b* and 116*b* have been configured to receive a "menu" input indicating that the user would like to view options from a menu. Areas 112*c* and 116*c* have been configured to receive a "home" input indicating that the user would like to view information associated with a "home" view. In other embodiments, areas 112*a-c* and 116*a-c* may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112*a*-C and 116*a*-C may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1B:
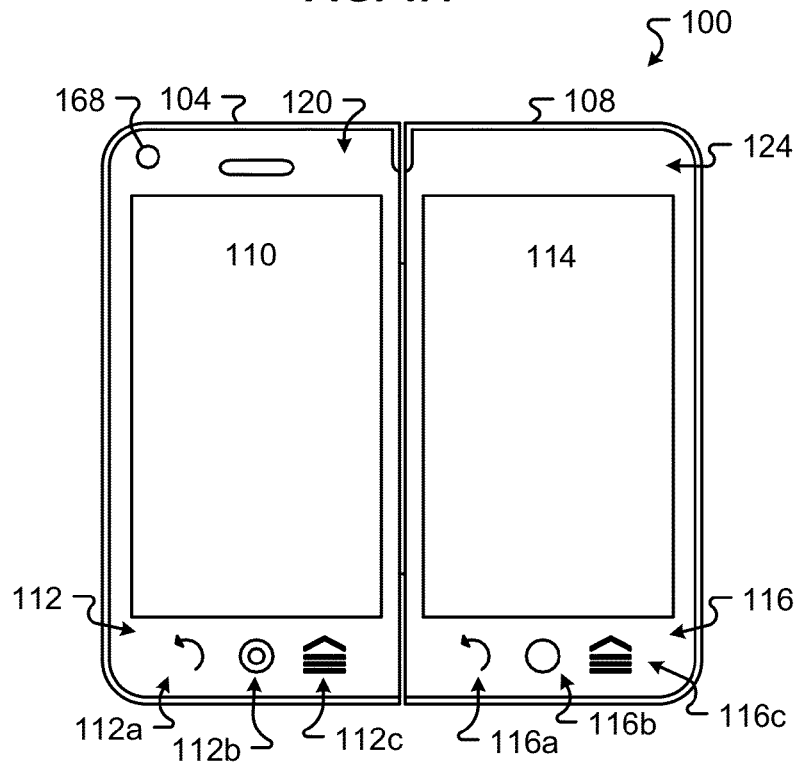
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
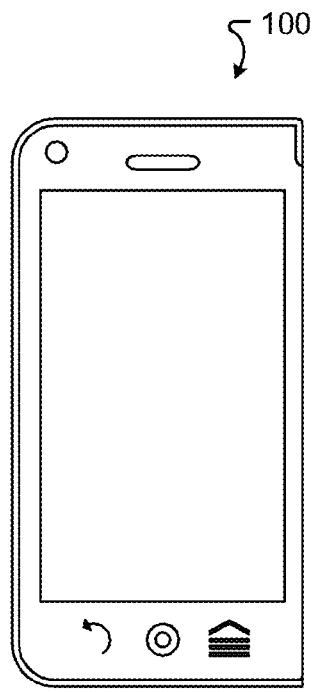
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
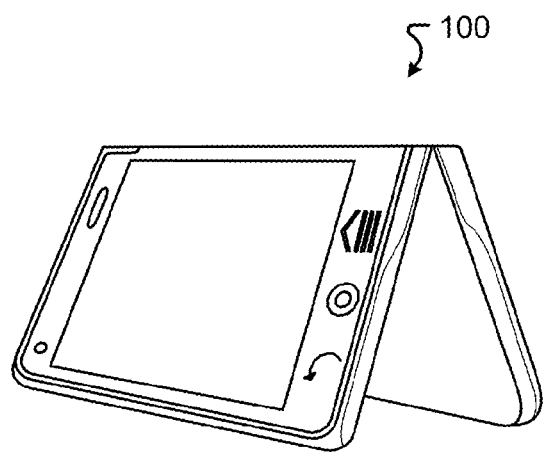
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
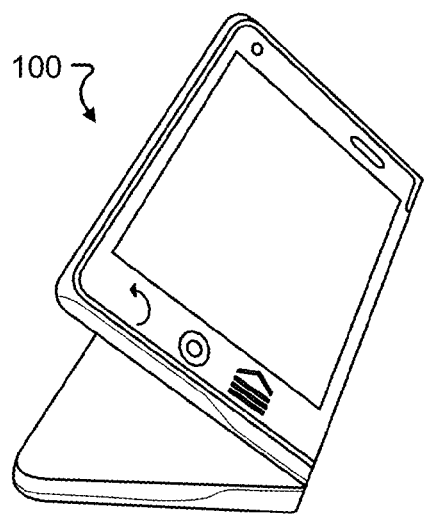
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are nonlimiting.

Figure 2:
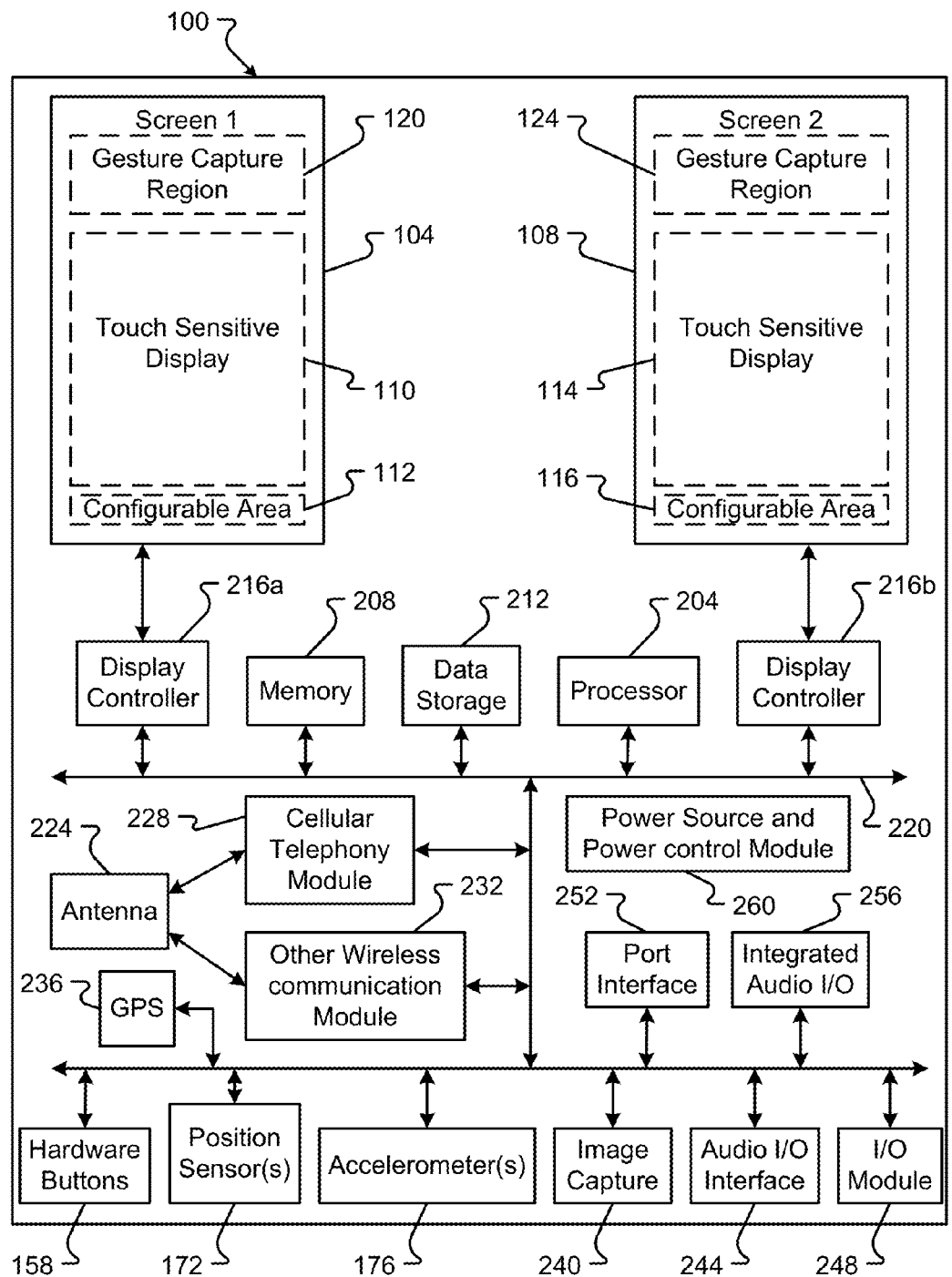
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller 216 may be used to control each of the included touch sensitive screens 104 and 108. In accordance with still other embodiments, the functions of a touch screen controller 216 may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
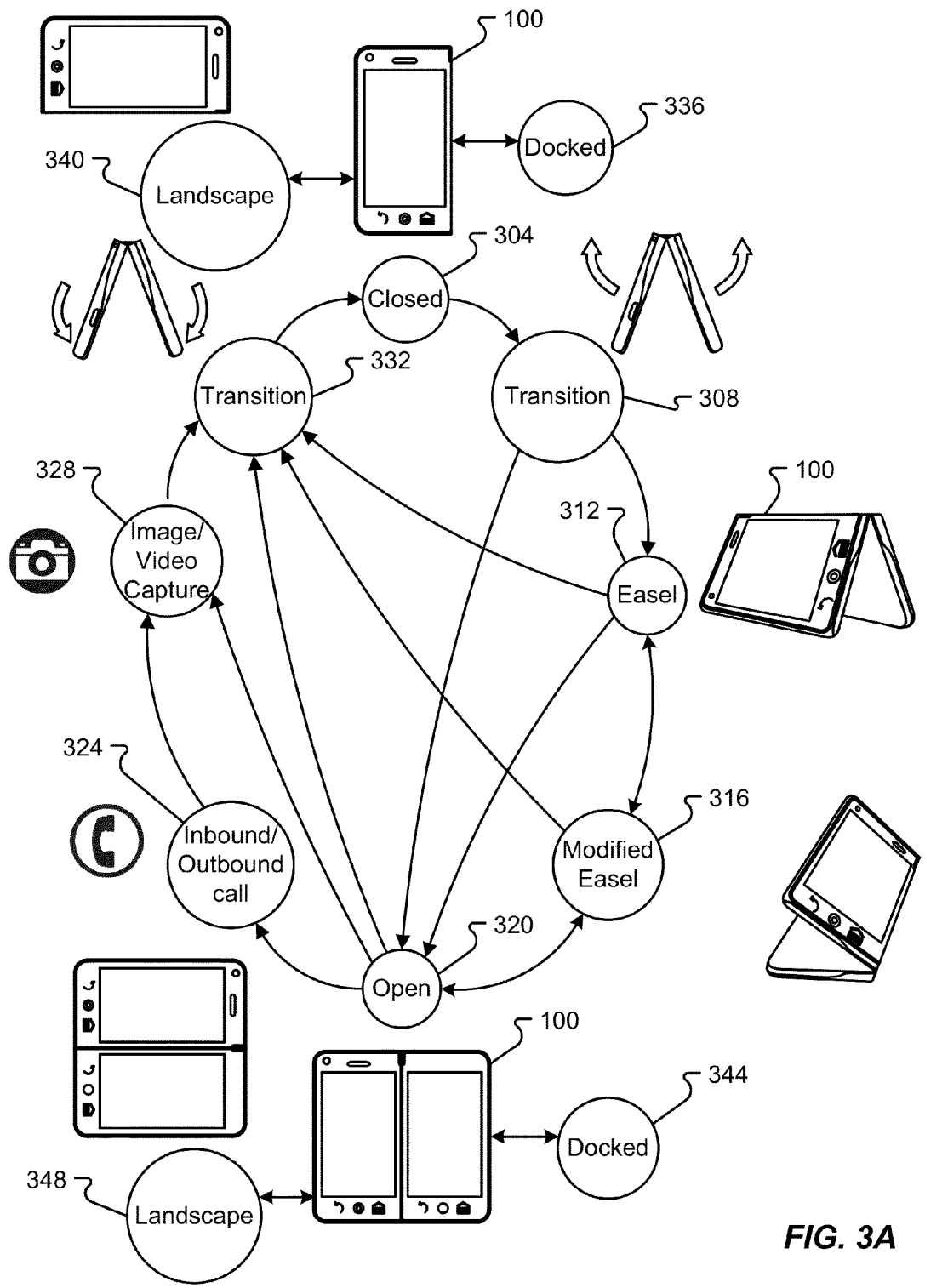
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed by the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge. Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 322 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110, 114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
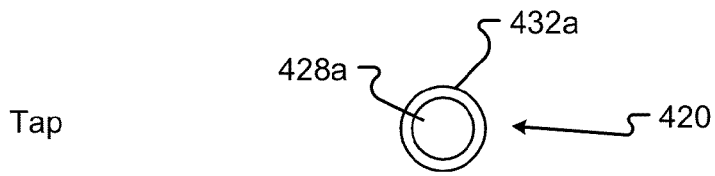
FIG. 4A is a first representation of an embodiment of user gesture received at a device.
Figure 4B:
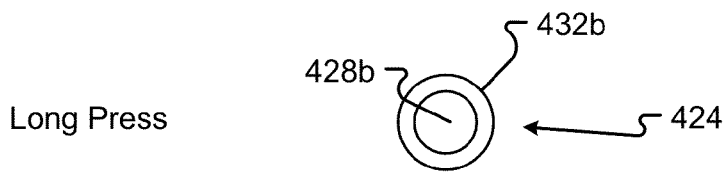
FIG. 4B is a second representation of an embodiment of user gesture received at a device.
Figure 4C:
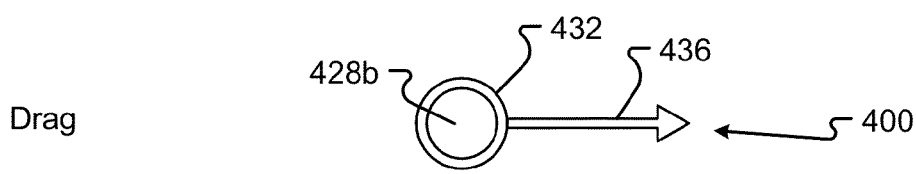
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
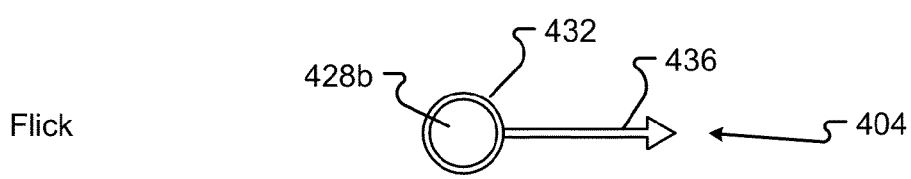
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
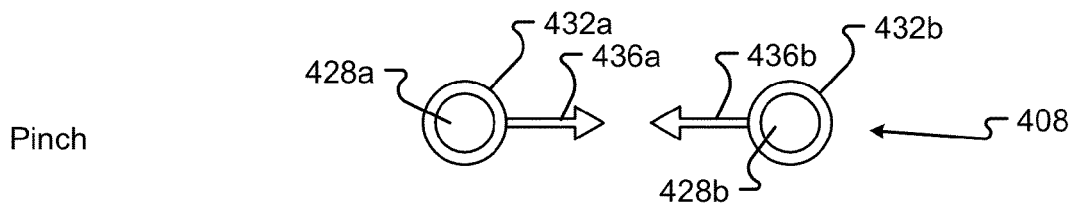
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
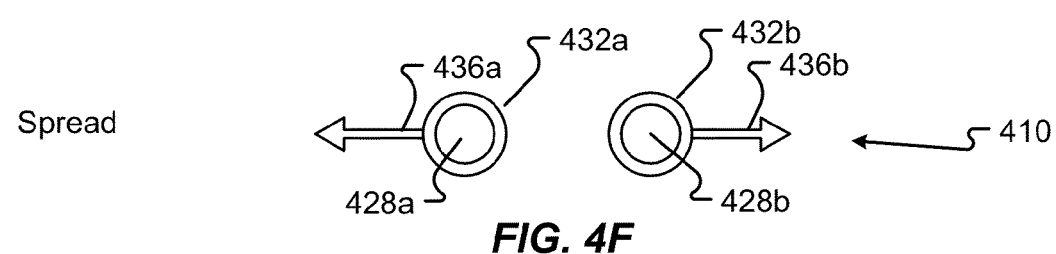
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
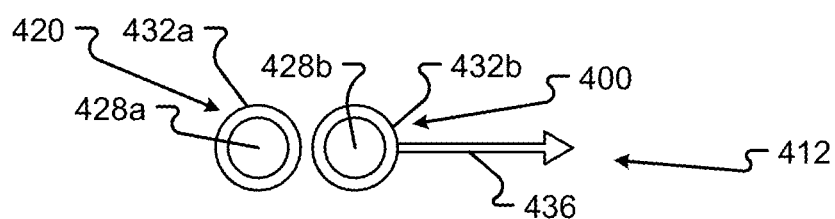
FIG. 4G is a seventh representation of an embodiment of user gesture received at a device.
Figure 4H:
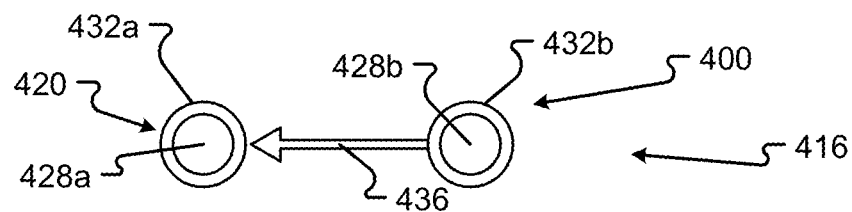
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564a and/or 564b from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event," which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can upscale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110, 114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
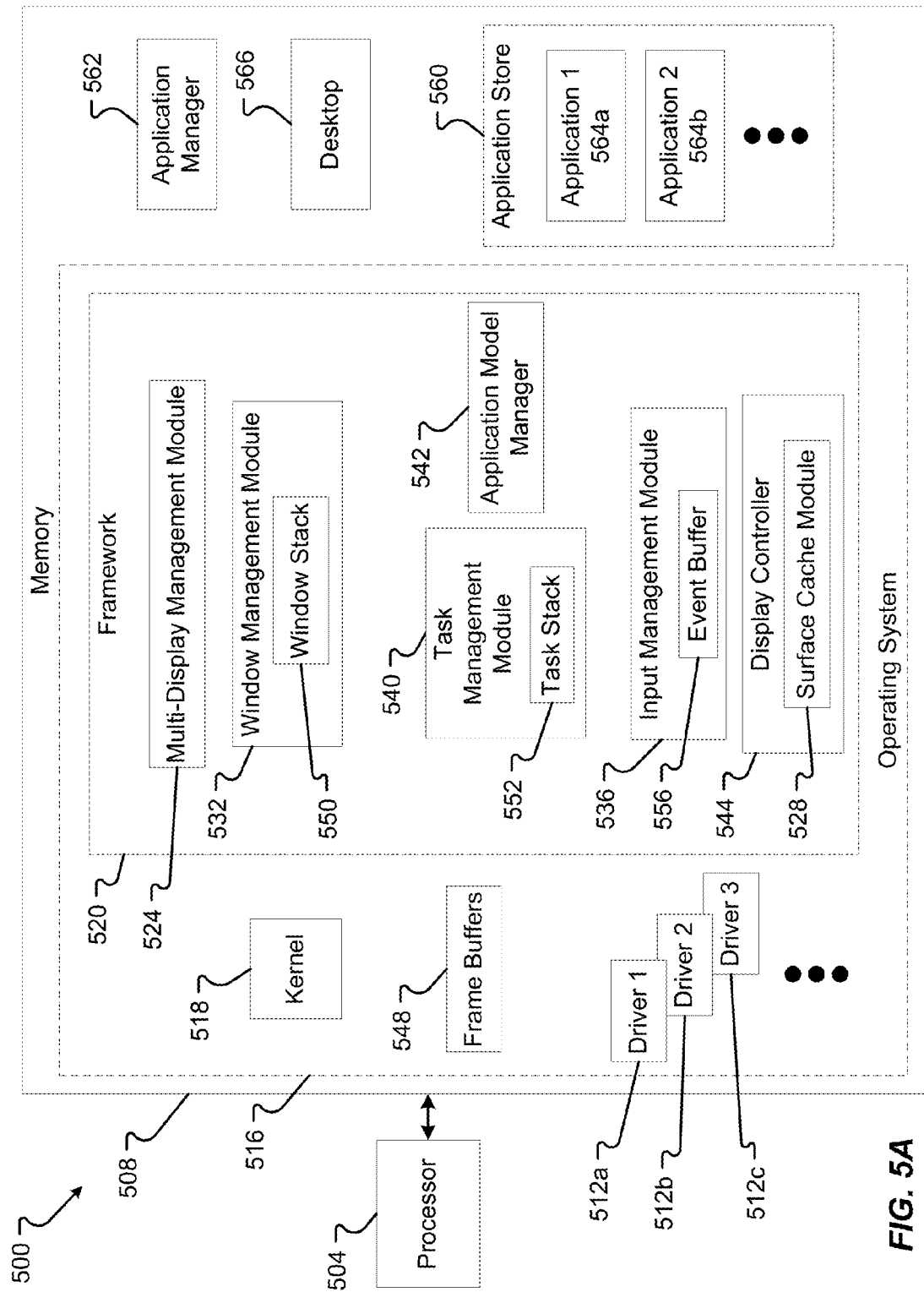
FIG. 5A is a block diagram of an embodiment of the device software and/or firmware.
Figure 5B:
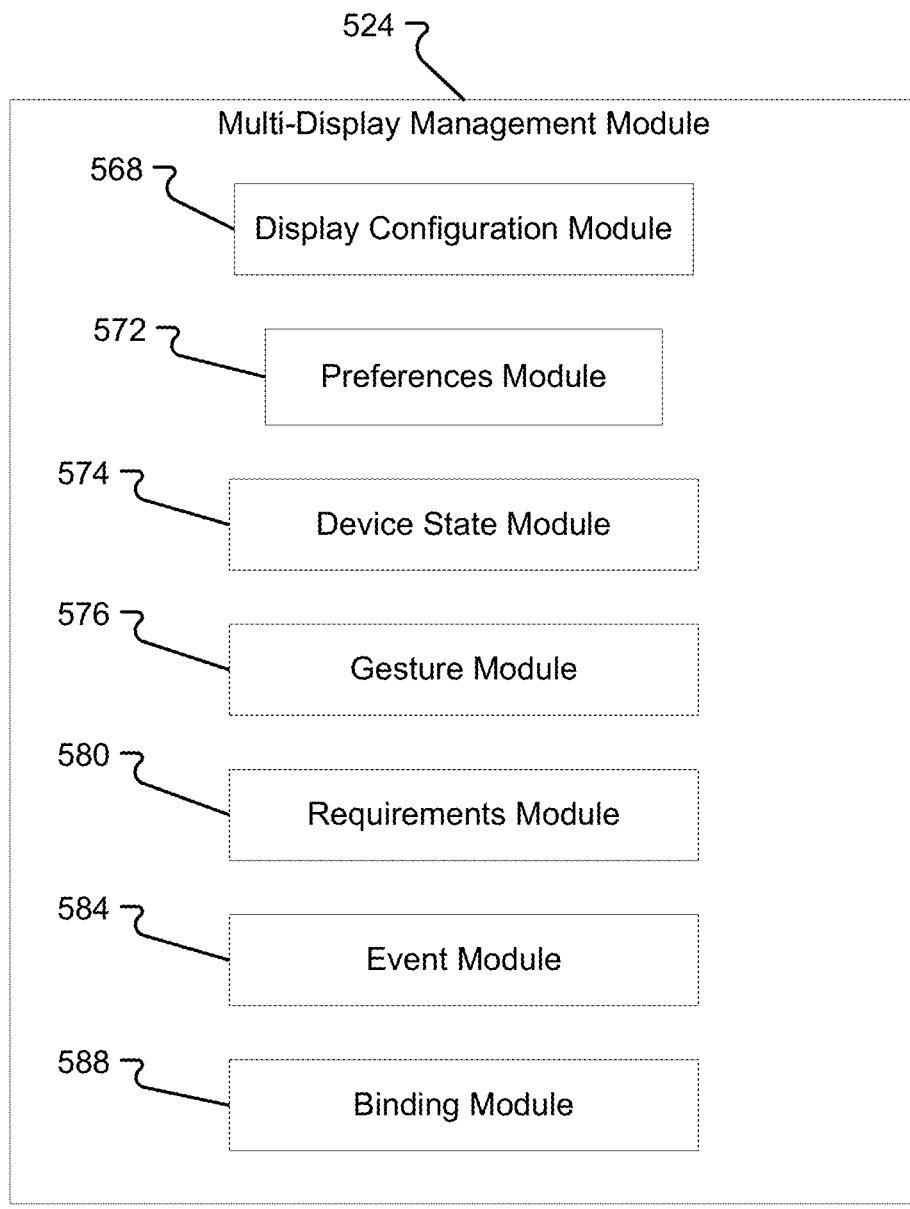
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114. Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
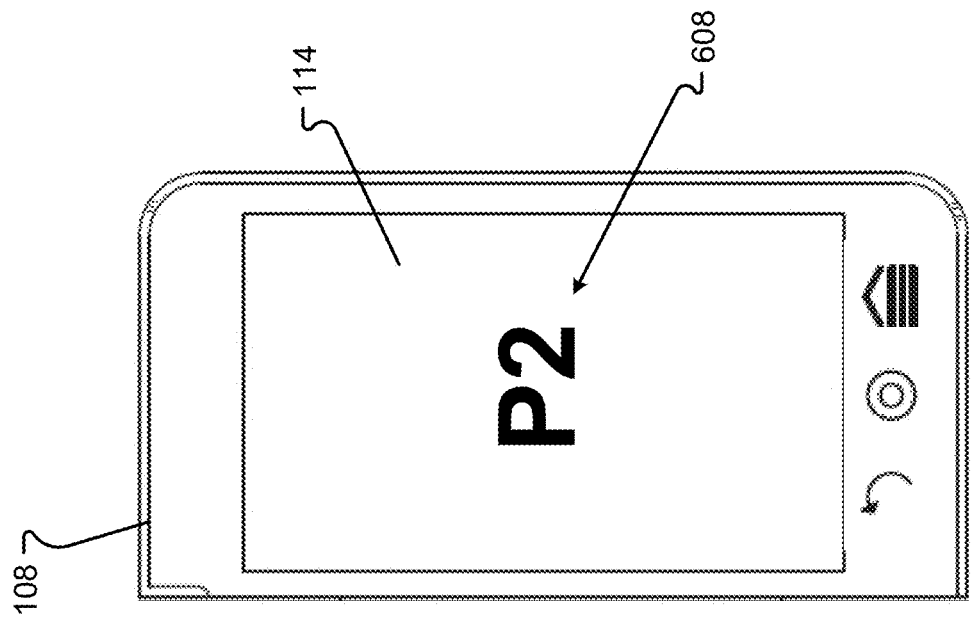
FIG. 6B is a second representation of an embodiment of a device configuration generated in response to the device state.
Figure 6A:
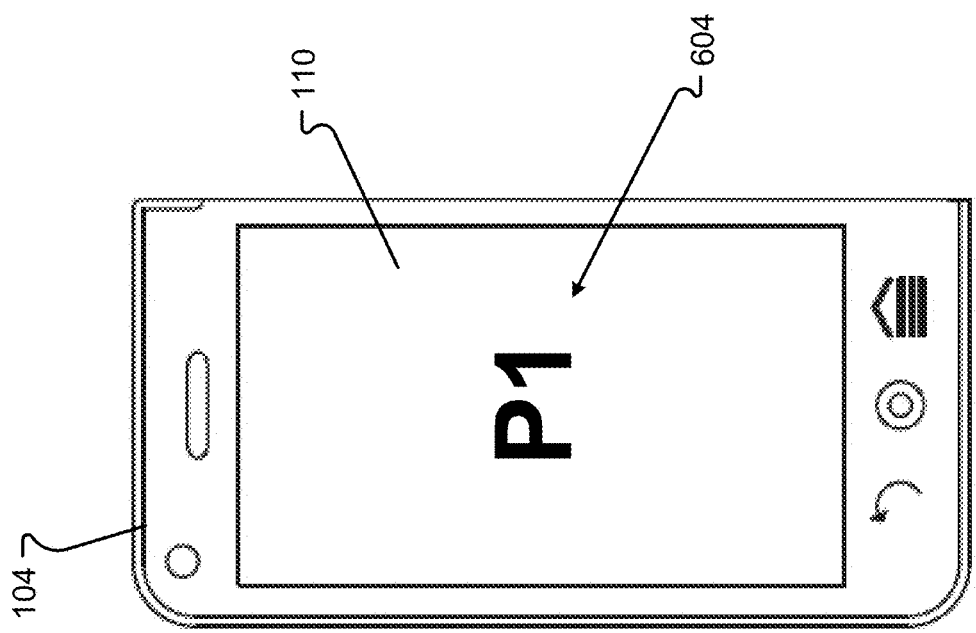
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
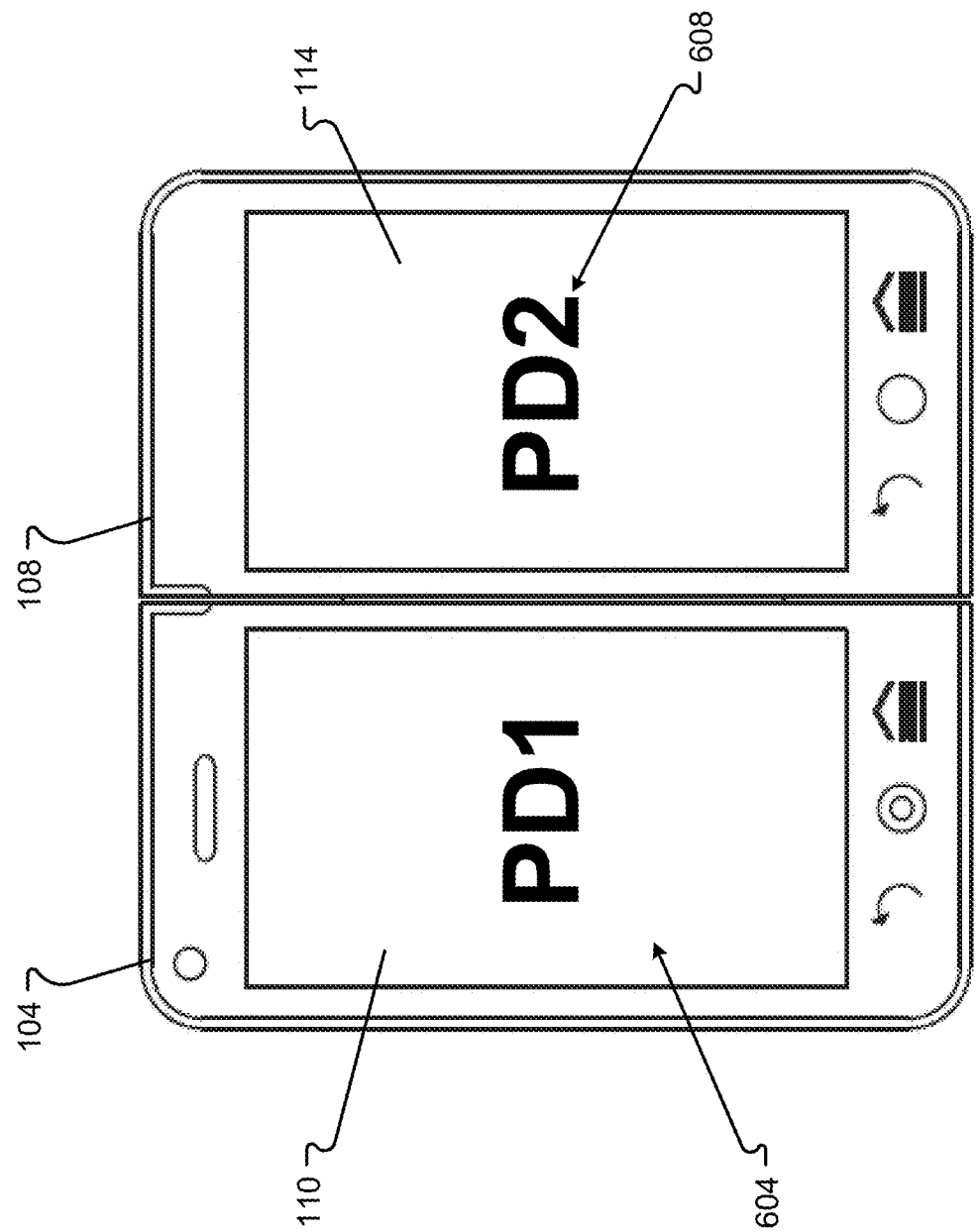
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6E:
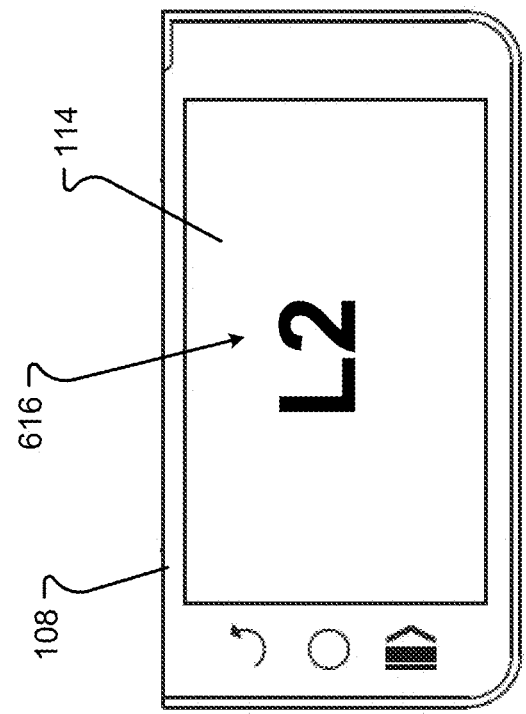
FIG. 6E is a fifth representation of an embodiment of a device configuration generated in response to the device state.
Figure 6D:
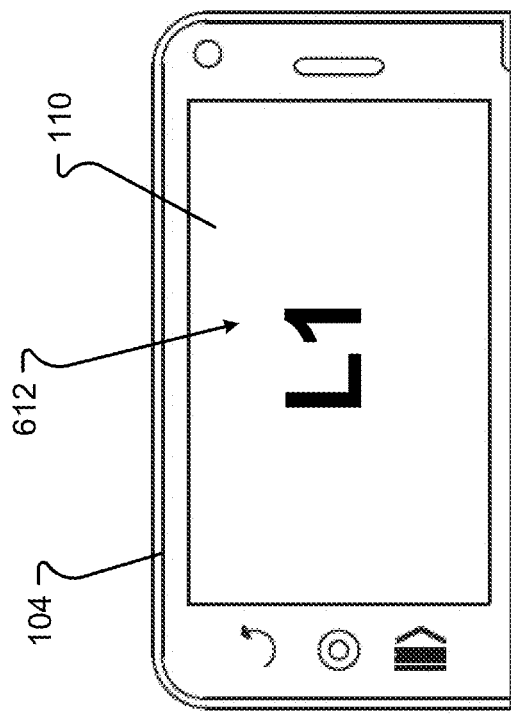
FIG. 6D is a fourth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
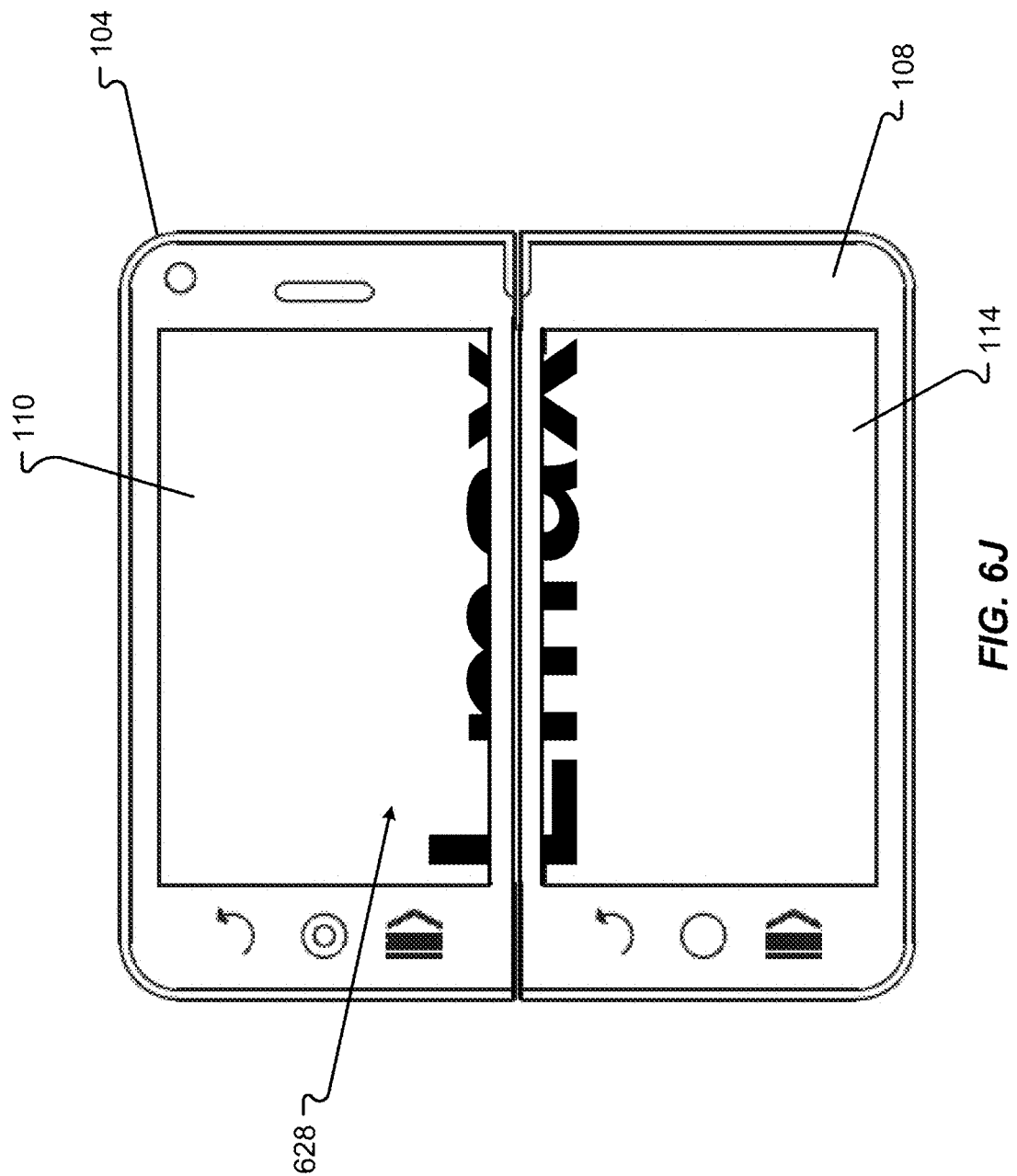
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

The device 100 manages each screen display independently, as will be described in FIGS. 7-15.

FIGS. 7A-J depict various configurations of the device 100 when configured with two displays. The device 100 is configured to manage and present each display independently of the other. Thus, for example, one display can present a portrait display orientation while the other presents a landscape display orientation. For example, as provided in FIG. 7B, a primary screen display 701 may be presented in a first display mode, such as a portrait mode $P_1$, and another secondary screen display 711 may be presented in a second display mode, such as landscape mode $L_1$. Both screens may also be presented in the same display mode, for example in a portrait mode, as provided in FIG. 7A. In FIG. 7A, both screens are presented in portrait mode, that is primary screen 701 in portrait mode $P_1$ and secondary screen 702 in portrait mode $P_2$. Similarly, both screens may be presented in a second mode, for example in a landscape mode, as provided in FIG. 7F. In FIG. 7F, primary screen 713 is presented in a second mode, depicted as a landscape mode $L_3$, and secondary screen 711 also in a second mode depicted as a landscape mode $L_1$. Each of FIGS. 7A-J depict combinations of screen displays for a multi-display device 100 with two displays, each display configured to present a first display mode and a second display mode, in which the first display mode is a portrait display and the second display mode is a landscape display. Other modes of display are possible, although not depicted in FIGS. 7A-J.

The device 100 is further configured to independently manage and configure each display independently of the orientation of the device 100, subject to inputs from one or both of the user and applications running on the device 100. For example, upon rotation of the device, each screen display may be configured to maintain (or lock) its orientation or may be configured to allow its orientation to change (an unlocked configuration). The display orientation characteristics are based on the user's desires and/or requirements of any hosted application. The user may selectively change desired display orientation characteristics for each screen. For example, a comparison of FIG. 7B with that of FIG. 7F illustrates a configuration of device 100 in which the primary screen 701 of FIG. 7B is configured in unlocked portrait display $P_1$. Upon a 90 degree clockwise rotation of FIG. 7B to that depicted in FIG. 7F, the primary screen (713 in FIG. 7F, 701 in FIG. 7B) reconfigures to a landscape display $L_3$, given the horizontal orientation of device 100 in FIG. 7F. In contrast, a comparison of FIG. 7B with that of FIG. 7H illustrates a configuration of device 100 in which the primary screen 701 of FIG. 7B is configured in a locked portrait display $P_1$. Upon a 90 degree clockwise rotation of FIG. 7B to that depicted in FIG. 7F, the primary screen (701 in FIG. 7H, 701 in FIG. 7B) remains in a portrait display configuration of $P_1$, independent of the horizontal orientation of device 100 in FIG. 7H.

Figure 8:
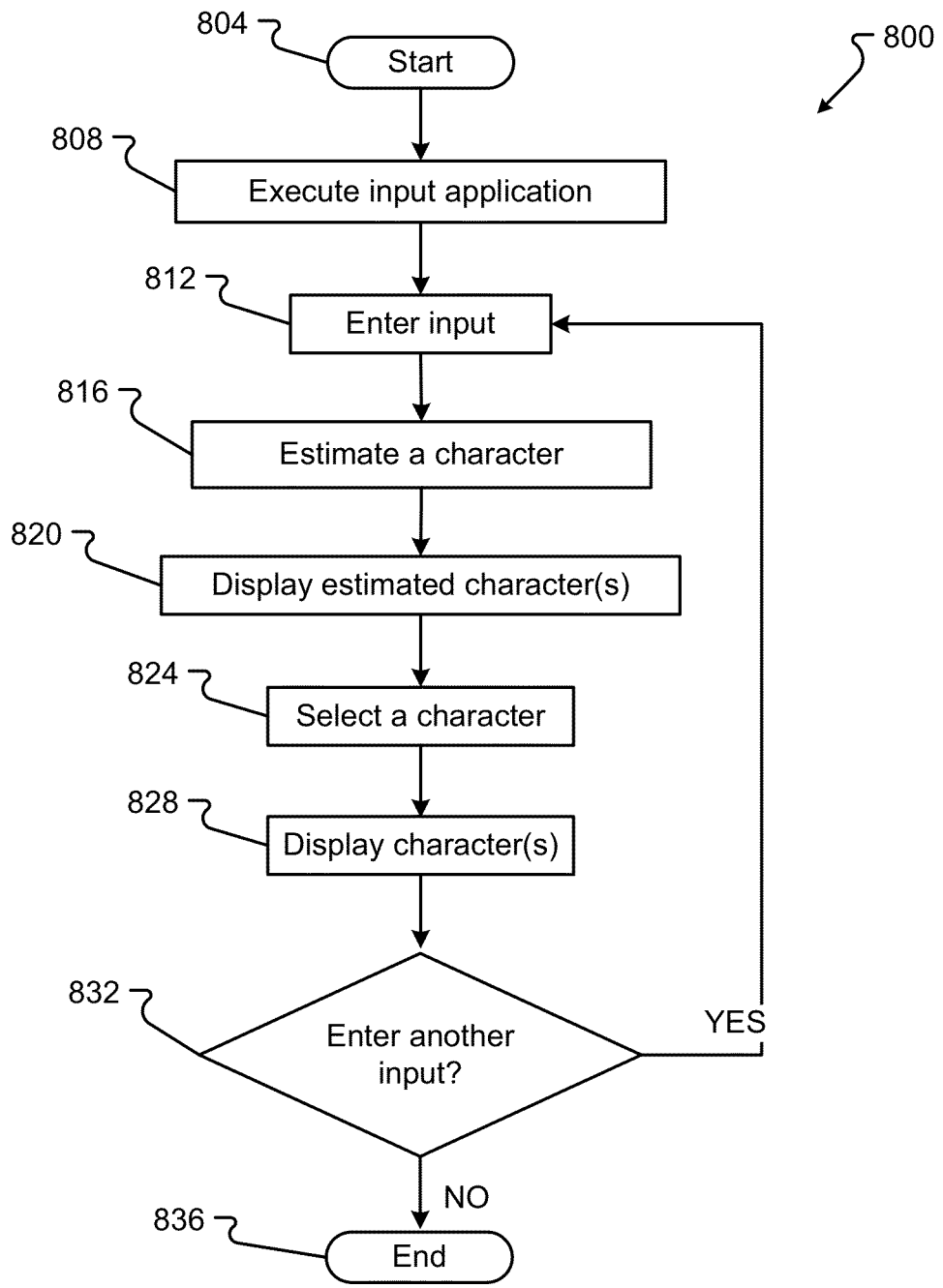
FIG. 8 is a representation of an embodiment of a dual-screen device presenting an exemplary method for using an input application.

An embodiment of a method 800 for executing an input application is shown in FIG. 8. While a general order for the steps of the method 800 is shown in FIG. 8. Generally, the method 800 starts with a start operation 804 and ends with an end operation 832. The method 800 can include more or fewer steps or can arrange the order of the steps differently than those shown in FIG. 8. The method 800 can be executed as a set of computer-executable instructions executed by a computer system and encoded or stored on a computer readable medium. Hereinafter, the method 800 shall be explained with reference to the systems, components, modules, software, data structures, user interfaces, etc. described in conjunction with FIGS. 1-15.

The input application is an application that recognizes contact on a touch sensitive screen 104, 108. In certain embodiments, the input application may be an application for recognizing handwritten input. In other words, the application may recognize motions traced on a touch sensitive screen, and associate the trace with certain characters, words, and/or sentences.

A processor 204 can receive an indication to execute the application through a user interface 110, 114, 112, 116, etc. The indication can be a selection of an icon associated with the application. In other embodiments, the indication can be a signal generated from another application or event, such as receiving an e-mail or other communication, which causes the application to execute automatically. The processor 204 can retrieve the application 564a from the application store 560 and begin its execution. In executing the application 564a, a user interface can be generated for a user, as described in conjunction with FIGS. 14-15.

Using the user interface, in step 808, input may be entered by contact on a touch sensitive screen 104, 108. The input may be a language input, a cursive input, and/or a pinyin input. A language input can be any type of input to convey communicative meaning. A language input can be a character, a partial character, a word, or a partial word, a phrase, or a partial phrase. A cursive input can be a traced input where symbols of a language are written in a conjoined and/or flowing manner, or in a manner that makes writing faster. Cursive may also be known to those of ordinary skill in the art as handwriting, joined-up writing, joined writing, linking, running writing, handwriting, looped cursive, cursive italic, Hebrew cursive, and/or Roman cursive. A pinyin input can be in a character or script in Chinese or Latin, for example. Pinyin is a system to transcribe Asian characters to Latin script, and vice versa. Pinyin may also be known to those of ordinary skill in the art as pinyin wenzi, Hanyu pinyin wenzi, or New Phonetic System. The input may be in various languages such as English, Chinese, and Arabic, and may also include numbers and special characters, for example.

Various exemplary input applications are described in FIGS. 11-13, below. The input may be entered and/or displayed on any touch sensitive screen 104, 108, and may be on the same screen, or a separate screen, from other user interface components. The input may be entered and/or displayed across both touch sensitive screens 104, 108, or on a portion of any of the touch sensitive screens 104, 108.

The input application can estimate a character, in step 816, based on the input. The input application can interface with a logical data structure, as described below in FIG. 9. In step 820, the application can display an estimated character based on the input. The estimated character can be selected by the application using a logical data structure, and may be characters in various fonts or text sizes, cursive characters, words, or phrases, for example. The estimated character may be in various languages or systems such as English, Chinese, Pinyin, and Arabic, and may also include numbers and special characters, for example.

The estimated character may be displayed on any touch sensitive screen 104, 108, and may be on the same screen, or a separate screen, from other user interface components. The estimated character may be displayed across both touch sensitive screens 104, 108, or on a portion of any of the touch sensitive screens 104, 108. The estimated character may be displayed on the same screen as the input, or on a separate screen from the input. The estimated character may be a list of predicted character options, where the list of predicted character options are several estimated characters, or a list created by the application or from a logical data structure, for example. A list of predicted character options may be displayed on any touch sensitive screen 104, 108, across multiple screens, and may be on the same screen, or a separate screen, from other user interface components.

The input application, or another application or user, may select a chosen character in step 824. The chosen character may be selected from the estimated character(s), or from other sources, such as a logical data structure. The chosen character may be in various languages such as English, Chinese, Pinyin, and Arabic, and may also include numbers and special characters, for example.

In step 828, the chosen character can be displayed. The chosen character may be displayed on any touch sensitive screen 104, 108, and may be on the same screen, or a separate screen, from other user interface components. The chosen character may be displayed across both touch sensitive screens 104, 108, or on a portion of any of the touch sensitive screens 104, 108. The chosen character may be displayed in various fonts or text sizes and on the same screen as the input or estimated character, or on a separate screen from the input or estimated character. In step 832, if another input is to be entered, the application proceeds YES to step 812. If no other input is to be entered, the method 832 proceeds NO to end operation 836.

In embodiments, the device executing the input application may be communicatively connected to other devices, for example, a personal computer or a smartpad, or a tablet computer. Thus, aspects of the user interface may be displayed on a screen of a device (e.g., the estimated characters or chosen characters), while input may be entered and displayed on a touch sensitive screen of another device.

Figure 9:
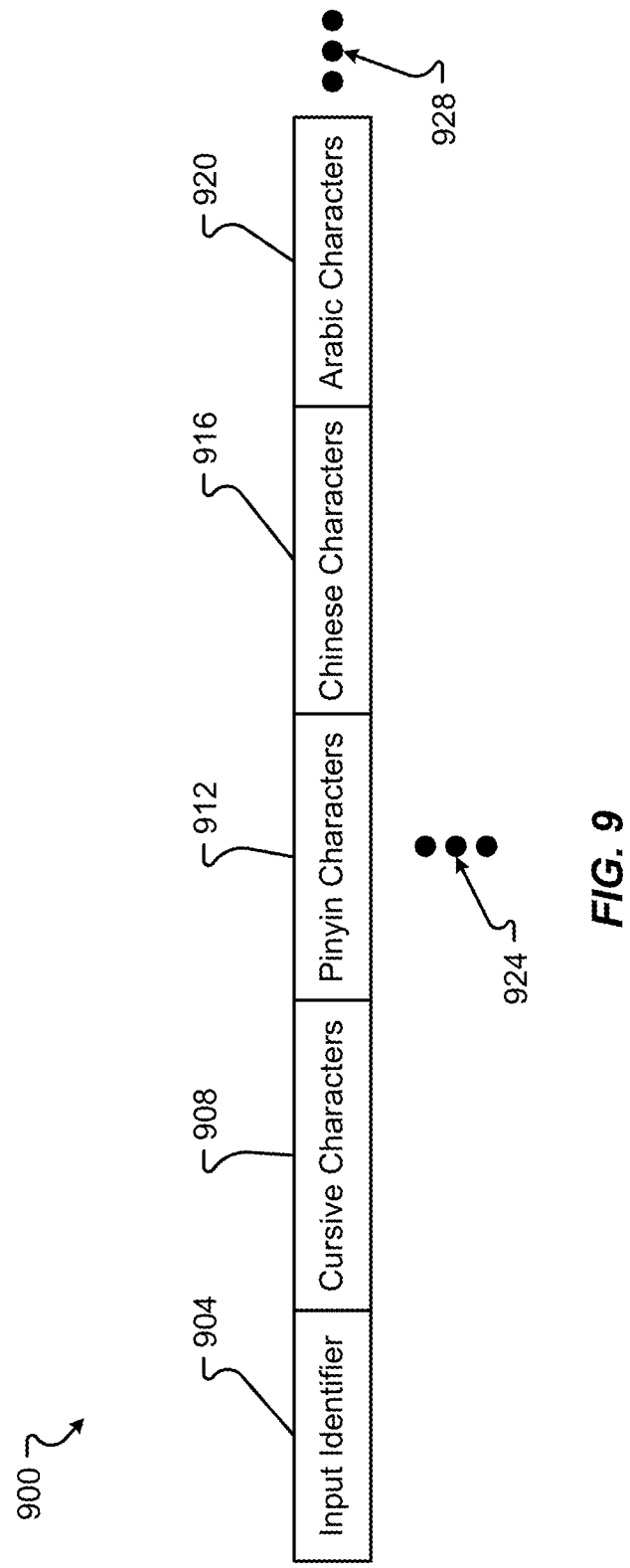
FIG. 9 is block diagram of an embodiment of a logical data structure for an input application.

A logical data structure 900 for the input application is shown in FIG. 9. The logical data structure 900 can be any data structure used to store data whether an object, record, file, etc. The logical data structure 900 can be stored in any type of database or data storage system, regardless of protocol or standard. In embodiments, the logical data structure 900 includes one or more portions, fields, attributes, etc. that store data in a logical arrangement that allows for easy storage and retrieval of the information. Hereinafter, these one or more portions, fields, attributes, etc. shall be described simply as fields. The fields can store data for an input identifier 904, cursive characters 908, Pinyin characters 912, Chinese characters 916, and/or Arabic characters 920, as well as other data (not shown). For example, each input or estimated character can have an associated logical data structure 900. While only a single logical data structure 900 is shown in FIG. 9, there may be more or fewer logical data structures 900 used with an input application, as represented by ellipses 924. Further, there may be more or fewer fields than those shown in FIG. 9, as represented by ellipses 928.

Figure 10:
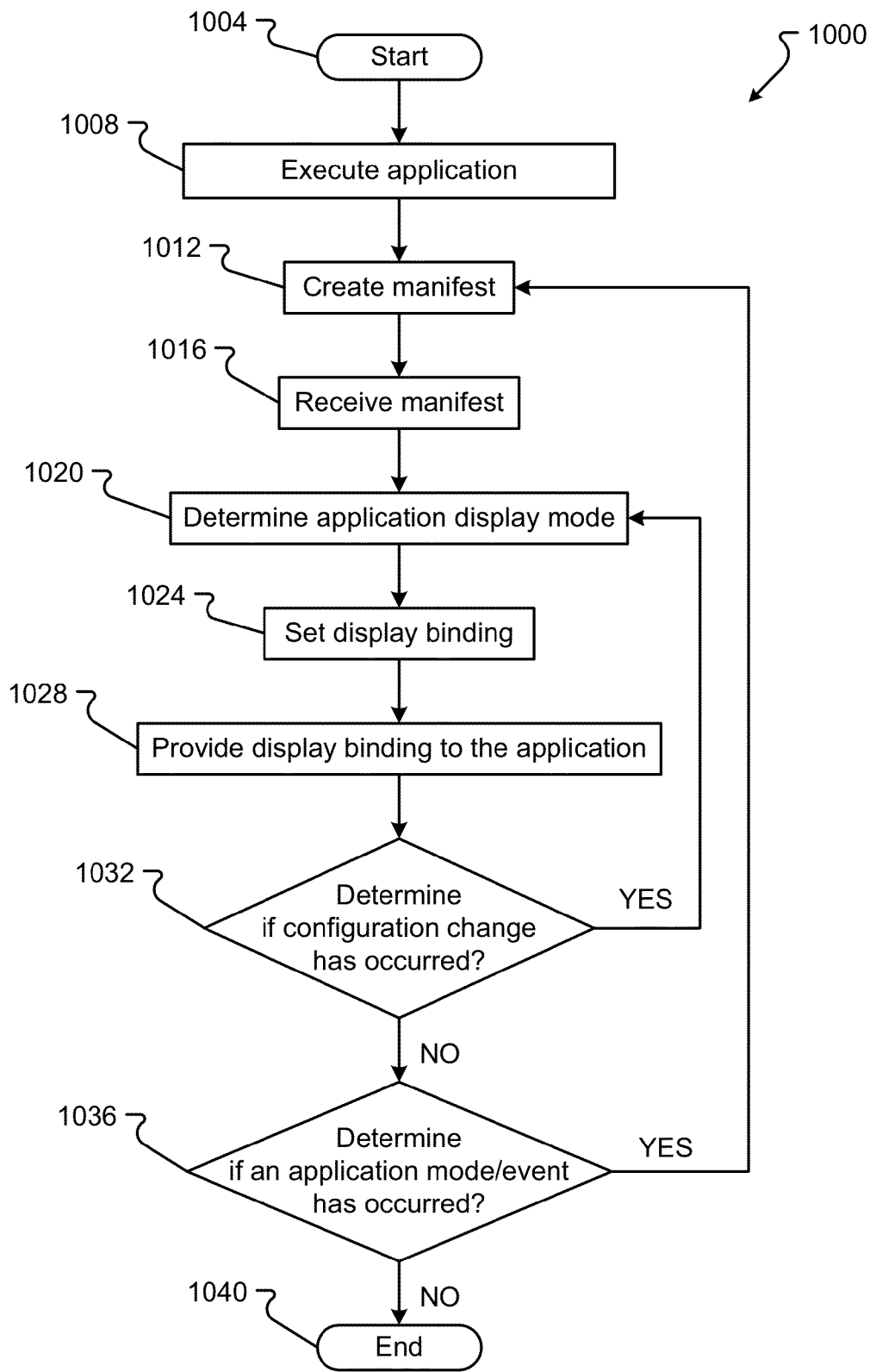
FIG. 10 is a representation of an embodiment of a dual-screen device presenting an exemplary method for managing the display of an input application.

An embodiment of a method 1000 for executing an application is shown in FIG. 10. While a general order for the steps of the method 1000 is shown in FIG. 10. Generally, the method 1000 starts with a start operation 1004 and ends with an end operation 1040. The method 1000 can include more or fewer steps or can arrange the order of the steps differently than those shown in FIG. 10. The method 1000 can be executed as a set of computer-executable instructions executed by a computer system and encoded or stored on a computer readable medium. Hereinafter, the method 1000 shall be explained with reference to the systems, components, modules, software, data structures, user interfaces, etc. described in conjunction with FIGS. 1-15.

An input application is executed, in step 1008, which can create a user interface. In creating a user interface, the application 564*a* can begin executing to create a manifest, in step 1012. A manifest is a data structure that indicates the capabilities of the application 564*a*. The manifest can generally be created from the resources in the resources directory of the application 564*a*. The resources directory can indicate the types of modes, locations, or other indications for how the user interface should be configured in the multi-display device 100. For example, the several modes can include: "classic mode" that indicates that the application 564*a* is capable of being displayed on a single screen or display 110/114; "dual mode" that indicates that the application 564*a* is capable of being displaced on two or more displays 110 and 114; "max mode" that indicates the application 564*a* is capable of being displayed or desires to be displayed across multiple displays 110 and 114; and/or "bilateral mode" that indicates that the application 564*a* is capable of being displayed on 2 or more displays 110 and 114 when the device 100 is in easel mode (see FIGS. 1I and/or 1J).

Similarly, the manifest can include a desired or allowed location within the displays 110/114. The possible locations can include: "left", which indicates that the application 564a desires to be displayed on the left display 110; "right", which indicates that the application 564a desires to be displayed on the right display 114; and/or other indications of where a location should be including possible "top" and/or "bottom" of one or more of the displays 110/114.

The application 564a can also indicate that it desires to be displayed in a "minimum" window, which is a window that occupies less than the full area of a single display. There may be other modes possible for the application 564a, which may be included in the manifest. The manifest can be sent from the application 564a to the multi-display management module 524.

The multi-display management module 524 can receive the manifest, in step 1016. In receiving the manifest, the multi-display management module 524 can use the information to determine a display binding for the application 564a. The manifest may be received more than once from the application 564a based on changes in how the application 564a is being executed, where the application 564a desires to have a different display setting for the new mode. Thus, with the manifest, the application 564a can indicate to the multi-display management module 524 how best to or what is the desired for the application's user interface. The multi-display management module 524 can use the information in the manifest to determine the best fit for the user interface depending on how the device 100 is currently configured.

The multi-display management module 524 can determine the application display mode, in step 1020. Here the multi-display management module 524 receives or retrieves an indication of the device 100 configuration. For example, the multi-display management module 524 can determine if the device is in single display configuration (see FIG. 6A, 6B, 6D, or 6E), dual display configuration (see FIG. 6C or 6F), bilateral display configuration (see FIG. 6G or 6H), or one of the other display configurations (see FIG. 6I or 6J).

Further, the multi-display management module 524 can determine if the device 100 is in a portrait or landscape orientation. With this information, the multi-display management module 524 may then consider the capabilities or preferences listed for the application 564a in the received manifest. The combined information may then allow the multi-display management module 524 to determine a display binding. The display binding can include which of the one or more displays 110 and/or 114 are going to be used to display the application's user interface(s). For example, the multi-display management module 524 can determine that the primary display 110, the secondary display 114, or all displays 110 and 114 of the device 100 will be used to display the application's user interface.

The display modes setting can be assigned by creating or setting a number in the display binding. This number can be "0" for the primary display 110, "1" for the secondary display 114, or "2" for dual displays 110 and 114. The display mode setting can also indicate if the application 564a should display the user interface in portrait or landscape orientation. Further, there may be other settings, for example, providing a max mode or other setting that may indicate how the application 564a is to be displayed on the device. The display binding information is stored in a data structure to create and set a binding, in step 1024.

The established display binding may then be provided, by the multi-display management module 524, to the application 564a, in step 1028. The provided display binding data structure can become an attribute of the application 564a. An application 564a may thereinafter store the display binding attribute in the memory of the device 100. The application 564a with the display binding may then generate a user interface based on this display binding. The application 564a may be unaware of the position of the display 110/114 but may, from the display binding, be able to determine the size of the available user interface to generate a window that has particular characteristics for that display setting.

When a configuration change happens to the device 100, the multi-display management module 524 may change the display binding and send a new display binding to the application 564a. In embodiments, the multi-display management module 524 may indicate to the application 564a that there is a new binding or, in other embodiments, the application 564a may request a display configuration change or a new display binding, in which case the multi-display management module 524 may send a new display binding to the application 564a. Thus, the multi-display management module 524 can change the configuration of the display for the application 564a by altering the display binding for the application 564a during the execution of that application 564a.

The multi-display management module 524 thereinafter, while the application 564a is executing, can determine if there has been a configuration change to the device 100, in step 1032. The configuration change may be an event (see FIGS. 3A and 3B) triggered by one or more signals from one or more hardware sensor 172, 176, etc. For example, if the device 100 is changed from portrait 304 to landscape 340 orientation, Hall effect sensors 172 may indicate to the framework 520 that a display configuration change has been made. Other changes may include transitions from a single display 304 to a dual display configuration 320, by opening the device. Other types of configuration changes may be possible and may be signaled to alert the multi-display management module 524 of the configuration change. If a configuration change has been made, the method 1000 proceeds YES to step 1020 so that the multi-display management module 524 can determine new application display mode settings and create a new display binding, which may be passed to the application 564a. If there are no configuration changes, the method 1000 precedes NO to step 1036.

In step 1036, a new application mode change may be determined. Application mode changes can also occur in the application 564a, and thus, the application 564a can determine if something has occurred within the application 564a that requires a different display setting. The mode change can create a desire to change the display 110/114, and thus, require the application 564a to generate a new manifest. If the application 564a does sense a mode change or an event has occurred that requires a change in display setting, the method 1000 proceeds YES back to step 1012. At step 1012, a new manifest or preference is created by the application 564a that may be received by the multi-display management module 524 to determine if the multi-display management module 524 can change the display binding. If it is possible to provide the preferred display, the multi-display management module 524 can create a new display binding and send display binding back to the application 564a and allow the application 564a to alter its user interface. If no mode change is sensed or an event is not received to create a mode change, the method 1000 proceeds NO to end operation 1040.

Figure 11:
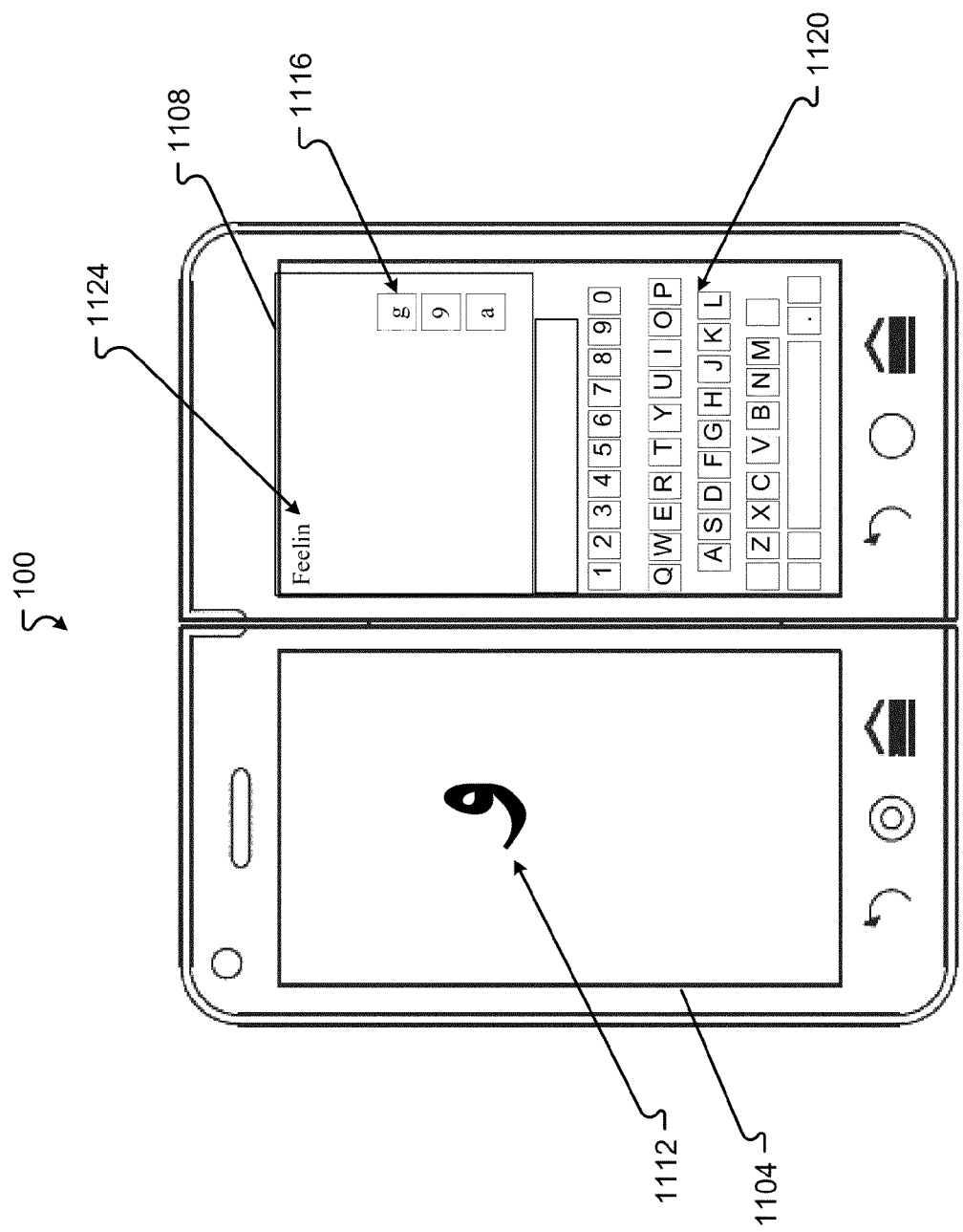
FIG. 11 is a representation of an embodiment of a dual-screen device presenting an exemplary method for managing the display of an input application.

An example of an input application in accordance with embodiments of the disclosure is shown in FIG. 11. The input application displays an input area on a touch sensitive primary screen 1104 of the device, and a user interface area on a secondary screen 1108 of the device. As shown, an input on the primary screen 1104 may be a handwritten input 1112, such as a character in cursive or in a language, for example, Chinese or Arabic. The input may also include fragments of a character or phonetic input. The user interface area on the secondary screen 1108 may include user interface components, such as a keyboard 1120, or menu items (not shown), and may show one or more characters 1116 that the application estimates from the input. The keyboard 1120 may be a Latin keyboard and may allow for selection of individual characters, character fragments, or character sets. In some embodiments, an estimated character may be selected to be shown in chosen characters 1124 on the secondary screen 1108 and additional input may modify the estimated character, chosen characters, or display.

The processor 204 can use analysis techniques to estimate a character based on the input 1112. For example, the analysis techniques may include Hidden Markov Model processing, Principal Components Analysis, Nearest Neighbor Analysis, Tangent Feature Recognition, and Letter Segmentation processing, as known in the art. Alternatively, the processor 204 may use linguistic or phonetic principles to estimate a character, for example, pinyin methods, as known in the art.

As a person of ordinary skill in the art would appreciate, using two or more screens for input and a user interface may advantageously provide additional space for input and interaction with the application. For example, increased space may allow for display of additional estimated characters, chosen characters, or increased font size. The increased screen area available to the application may enable improved performance and efficiency, such as increased input speed, and may allow for the display of additional menu items or other aspects of the application. As discussed in FIGS. 14-15, the user interface and input screens may be switched, and may be changed to portrait or landscape.

Figure 12:
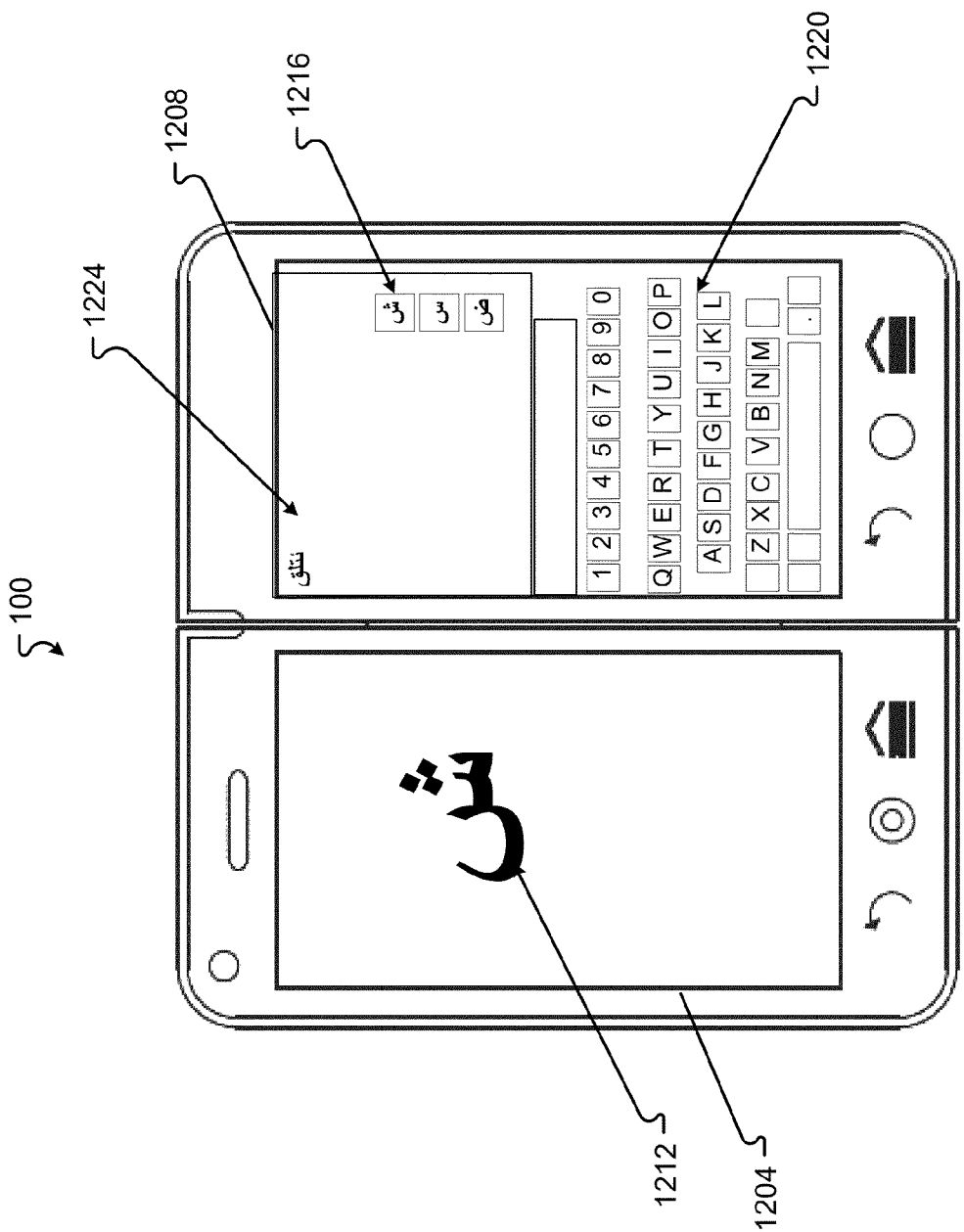
FIG. 12 is a representation of an embodiment of a dual-screen device presenting an exemplary method for managing the display of an input application.

An example of an input application in accordance with embodiments of the disclosure is shown in FIG. 12. The input application displays an input area on a touch sensitive primary screen 1204 of the device, and a user interface area on a secondary screen 1208 of the device. As shown, an input on the primary screen 1204 may be a handwritten Arabic language input 1212. The user interface area on the secondary screen 1208 shows one or more Chinese characters 1216 that the application estimates from the input. In some embodiments, an estimated character may be selected to be shown in a string of Arabic characters 1224 on the secondary screen 1208.

Figure 13:
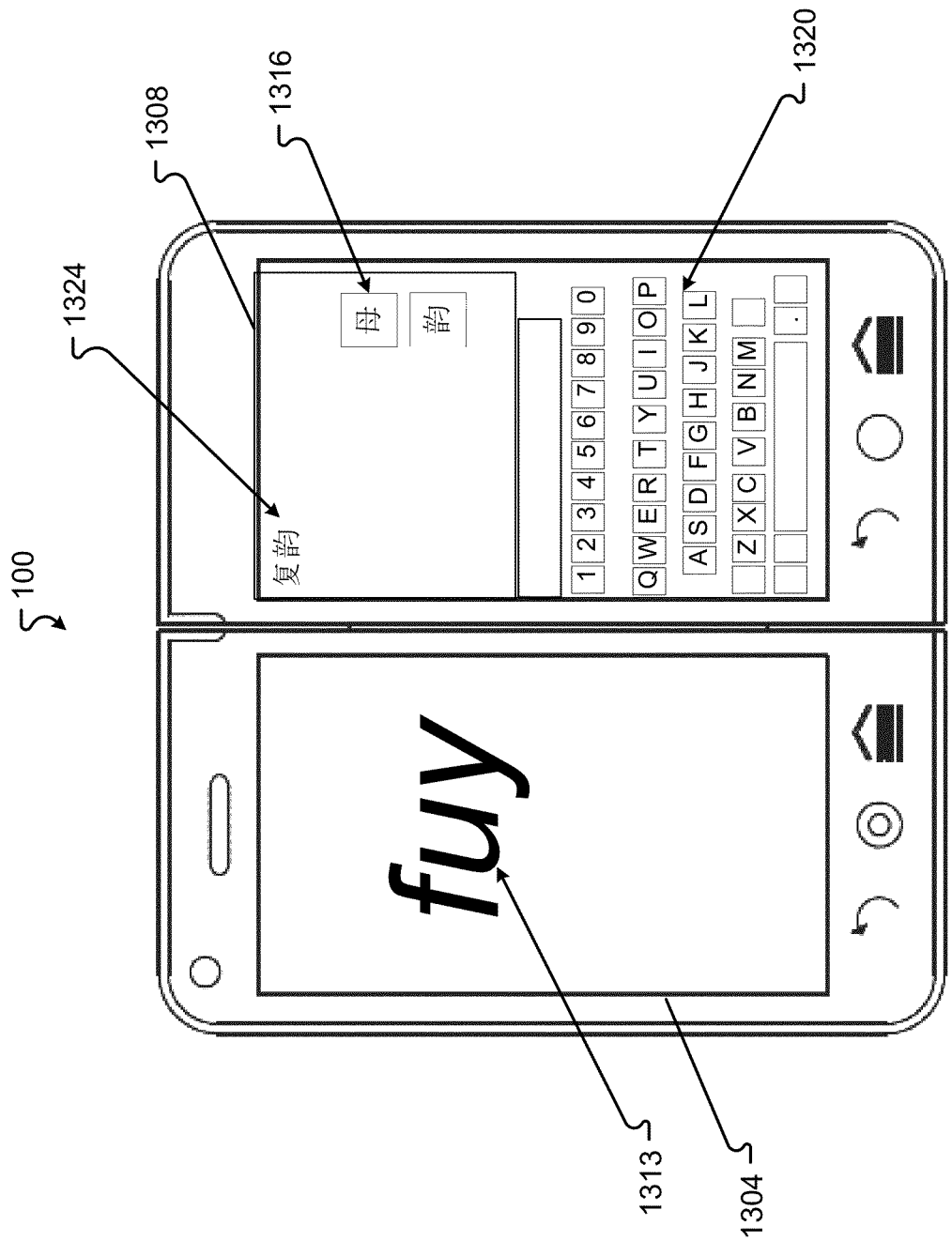
FIG. 13 is a representation of an embodiment of a dual-screen device presenting an exemplary method for managing the display of an input application.

A further example of an input application in accordance with embodiments of the disclosure is shown in FIG. 13. The input application displays an input area on a touch sensitive primary screen 1304 of the device, and a user interface area on a secondary screen 1308 of the device. As shown, an input on the primary screen 1304 may be a handwritten pinyin input 1312. The user interface area on the secondary screen 1308 shows one or more traditional or simplified Chinese characters 1316 that the application estimates from the input. In some embodiments, an estimated character may be selected to be shown in a string of traditional or simplified Chinese characters 1324 on the secondary screen 1308. In alternative embodiments, the user interface area on the secondary screen 1308 shows one or more Latin characters relevant to the pronunciation of Mandarin that the application estimates from the input. Persons of ordinary skill in the art will appreciate that this may advantageously allow a user to enter Mandarin or Chinese characters without requiring the user to trace the character, or any portion of the character, and other logographic or logosyllabic scripts (e.g., Korean, Japanese, Vietnamese, and/or Yucatec) may be implemented.

Figure 14:
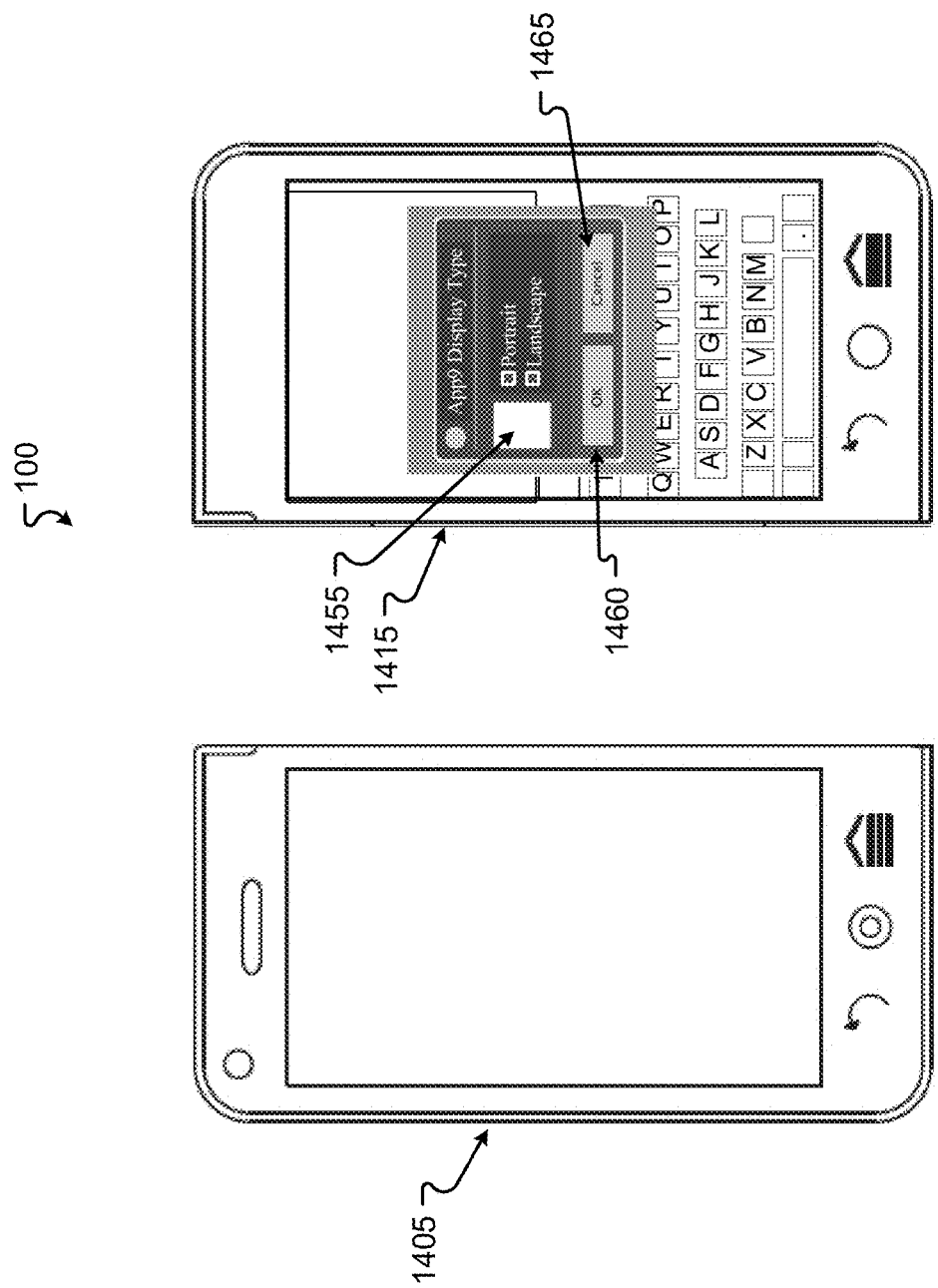
FIG. 14 illustrates an exemplary user interface for selecting a display orientation of one display of a dual-screen device.

An example of a user interface input that a user may execute to select the display mode of an application is shown in FIG. 14. The user can conduct one or more user interface actions that may select the display mode of the secondary screen 1415. For example, as shown in FIG. 14, the secondary screen 1415 may receive a "tap" or "touch" (as described in conjunction with FIG. 4A), in the gesture capture region 120, one or more times. In an example, the user may use their finger, stylus, pen, or other object to tap the gesture capture region 120 twice. This double tap action can be detected by the sensors associated with the gesture capture region 120. These interactions on the gesture capture region 120 can be detected, and an interrupt signal sent to the processor 204. Upon conducting the user interface actions, the touch sensitive display 110, on the secondary screen 1415, may display a window 1455. The window 1455 can require further user interface interaction. In embodiments, the user may need to confirm the desire to select a particular mode of display (such as portrait or landscape, as depicted in FIG. 14) by selecting user interface device 1460 in the touch sensitive display 110 of screen 1415. If the detection of the user interaction was incorrect, the user may select user interface device 1460 to cancel the selection of portrait or landscape for the application. FIG. 14 also depicts primary screen 1405.

Embodiments of user interface configurations for the multiple-screen device 100 is shown in FIGS. 15A through 15D. The configurations 1500 include a primary screen 1505 and a secondary screen 1510. The primary screen 1505 is typically enabled when presenting a user interface, generally when the device 100 is closed. With certain hardware for the phone, e.g., the speaker and the microphone located near the primary screen 1505, the user interface 1515 is generally displayed on the primary screen 1505. Further, the secondary screen 1510 is typically not used and remains off without a display 1520, as shown in FIG. 15B.

However, in some configurations, it is required to have the user interface displayed on the secondary screen 1510. For example, the user interface can be moved onto the secondary screen 1510 as shown in FIG. 15D. Thus, the user interface 1530 is displayed on the secondary screen 1510, while no user interface is shown on the primary screen 1505. Yet, in some embodiments, it may be possible to display one or more user interfaces on both the primary screen 1505 and the secondary screen 1510. Hereinafter, the secondary screen 1510 may also be referred to as the alternate screen.

The primary and secondary screen 1505, 1510 are, in embodiments, configured to face in opposite directions when the device is closed. This configuration is unique to the device 100 shown herein. Thus, transitions from the primary screen 1505 to secondary screen 1510, when in the closed state, are unique and novel feature of the device 100. There are various methods to transfer the display or change the display to the alternate or secondary screen 1510, as is described hereinafter.

In embodiments, the transition to the secondary screen 1510 may be accomplished through a selectable user interface device on a menu presented in the user interface. One such menu or user interface is shown in FIG. 14.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A method, comprising:
   providing a device having at least a primary display and a secondary display;
   a processor of the device receiving a first input in an input application that is operable to recognize handwritten input, wherein the first input comprises a language input associated with a language, and wherein the first input is received on the primary display;
   the processor processing the first input to estimate two or more characters, used in the language, that are similar to on-the first input;
   displaying the two or more estimated character(s) on the secondary display;
   receiving a selection of one of the two or more estimated character(s); and
   displaying the selection on the secondary display, wherein the selection comprises a chosen character selected from the two or more estimated character(s).

2. The method of claim 1, wherein the two or more estimated character(s) are displayed on the primary display and the selection is displayed on the secondary display.

3. The method of claim 1, wherein the two or more estimated character(s) and the selection are displayed on the secondary display.

4. The method of claim 1, wherein the two or more estimated character(s) comprise a list of predicted character options.

5. The method of claim 4, wherein the predicted character options comprise at least one of letters, words, and phrases.

6. The method of claim 1, further comprising: after displaying the two or more estimated character(s), receiving a second input, wherein the second input modifies at least one of the display of the two or more estimated character(s) or the display of the selection.

7. The method of claim 6, wherein the second input requests a display mode for the secondary display.

8. The method of claim 1, wherein the secondary display is configured with a user interface.

9. The method of claim 8, wherein the second input is provided through the user interface.

10. A device, comprising:
    a primary display;
    a secondary display;
    a memory;
    a processor in communication with the memory, the primary display, and the secondary display, the processor operable to:
    receive a first input in an input application that is operable to recognize handwritten input, wherein the first input comprises a language input associated with a language, and wherein the first input is received on the primary display;
    process the first input to estimate a character based on the first input;
    display the estimated character(s) on the secondary display;
    receive a selection of the estimated character; and
    display the selection on the secondary display, wherein the selection comprises a chosen character selected from the estimated character(s).

11. The device of claim 10, wherein the estimated character is displayed on the primary display and the selection is displayed on the secondary display.

12. The device of claim 10, wherein the estimated character and the selection are displayed on the secondary display.

13. The device of claim 10, wherein the estimated character comprises a list of predicted character options.

14. The device of claim 13, wherein the predicted character options comprise at least one of letters, words, and phrases.

15. The device of claim 10, wherein the processor is further operable to: after displaying the estimated character, receive a second input, wherein the second input modifies at least one of the display of the estimated character or the display of the selection.

16. The device of claim 15, wherein the second input requests a display mode for the secondary display.

17. A non-transitory computer readable medium having stored thereon computer-executable instructions, the computer executable instructions causing a processor of a device to execute a method for providing a user interface, wherein the device has at least a first display and a second display, the computer-executable instructions comprising:
    receiving a first input in an input application that is operable to recognize either handwritten input or keyboard input, wherein the first input comprises a language input associated with a first language, and wherein the first input is received on the first display;
    processing the first input to estimate a character associated with a second language based on the first input;
    displaying the estimated character(s) on the second display;
    receiving a selection of the estimated character; and
    displaying the selection on the second display, wherein the selection comprises a chosen character associated with the second language and selected from the estimated character(s).

18. The method of claim 17, wherein the estimated character is displayed on the primary display and the selection is displayed on the secondary display.

19. The method of claim 17, wherein the estimated character and the selection are displayed on the secondary display.

20. The method of claim 17, further comprising: after displaying the estimated character, receiving a second input, wherein the second input modifies at least one of the display of the estimated character(s) or the display of the selection.

* * * * *

UNITED STATES PATENT AND TRADEMARK OFFICE
CERTIFICATE OF CORRECTION

| | | |
|---|---|---|
| PATENT NO. | : 9,104,366 B2 | Page 1 of 1 |
| APPLICATION NO. | : 13/628157 | |
| DATED | : August 11, 2015 | |
| INVENTOR(S) | : Kretz | |

It is certified that error appears in the above-identified patent and that said Letters Patent is hereby corrected as shown below:

In the claims

Column 35, line 20, claim 1 delete "on-" therein.

Column 36, line 6, claim 10 delete "(s)" therein.

Column 36, line 41, claim 17 delete "(s)" therein.

Column 36, line 47, claim 17 delete "(s)" therein.

Signed and Sealed this
Twenty-second Day of March, 2016

Michelle K. Lee
*Director of the United States Patent and Trademark Office*